(12) United States Patent
Lee et al.

(10) Patent No.: US 9,607,904 B2
(45) Date of Patent: Mar. 28, 2017

(54) ATOMIC LAYER DEPOSITION OF HFALC AS A METAL GATE WORKFUNCTION MATERIAL IN MOS DEVICES

(71) Applicants: Intermolecular Inc., San Jose, CA (US); GLOBALFOUNDRIES, Inc., Grand Cayman (KY)

(72) Inventors: Albert Sanghyup Lee, Cupertino, CA (US); Paul Besser, Sunnyvale, CA (US); Kisik Choi, San Jose, CA (US); Edward L Haywood, San Jose, CA (US); Hoon Kim, San Jose, CA (US); Salil Mujumdar, San Jose, CA (US)

(73) Assignees: Intermolecular, Inc., San Jose, CA (US); GLOBALFOUNDRIES, INC., Grand Cayman (KY)

(*) Notice: Subject to any disclaimer, the term of this patent is extended or adjusted under 35 U.S.C. 154(b) by 0 days.

(21) Appl. No.: 14/094,691

(22) Filed: Dec. 2, 2013

(65) Prior Publication Data
US 2016/0035631 A1    Feb. 4, 2016

Related U.S. Application Data

(60) Provisional application No. 61/870,963, filed on Aug. 28, 2013, provisional application No. 61/858,921, (Continued)

(51) Int. Cl.
*H01L 21/28* (2006.01)
*H01L 21/66* (2006.01)
(Continued)

(52) U.S. Cl.
CPC ........ *H01L 22/10* (2013.01); *H01L 21/28088* (2013.01); *H01L 21/28158* (2013.01);
(Continued)

(58) Field of Classification Search
None
See application file for complete search history.

(56) References Cited

U.S. PATENT DOCUMENTS 6,579,775 B2   6/2003   Kizilyalli
2005/0271813 A1  12/2005   Kher
(Continued)

OTHER PUBLICATIONS

Krishna C. Saraswat, et al.; Work Function of WSi2; Feb. 1, 1980; IEEE.
(Continued)

*Primary Examiner* — Charles Garber
*Assistant Examiner* — Brigitte Paterson

(57) ABSTRACT

ALD of $Hf_xAl_yC_z$ films using hafnium chloride ($HfCl_4$) and Trimethylaluminum (TMA) precursors can be combined with post-deposition anneal processes and ALD liners to control the device characteristics in high-k metal-gate devices. Variation of the $HfCl_4$ pulse time allows for control of the Al % incorporation in the $Hf_xAl_yC_z$ film in the range of 10-13%. Combinatorial process tools can be employed for rapid electrical and materials characterization of various materials stacks. The effective work function (EWF) in metal oxide semiconductor capacitor (MOSCAP) devices with the $Hf_xAl_yC_z$ work function layer coupled with ALD deposited $HfO_2$ high-k gate dielectric layers was quantified to be mid-gap at ~4.6 eV. Thus, $Hf_xAl_yC_z$ is a promising metal gate work function material allowing for the tuning of device threshold voltages ($V_{th}$) for anticipated multi-$V_{th}$ integrated circuit (IC) devices.

20 Claims, 19 Drawing Sheets

Related U.S. Application Data filed on Jul. 26, 2013, provisional application No. 61/805,374, filed on Mar. 26, 2013, provisional application No. 61/776,188, filed on Mar. 11, 2013.

(51) Int. Cl.
*H01L 29/49* (2006.01)
*H01L 29/51* (2006.01)
*H01L 29/66* (2006.01)
*H01L 29/94* (2006.01)

(52) U.S. Cl.
CPC .......... *H01L 22/14* (2013.01); *H01L 29/4966* (2013.01); *H01L 29/517* (2013.01); *H01L 29/665* (2013.01); *H01L 29/6659* (2013.01); *H01L 21/28194* (2013.01); *H01L 29/94* (2013.01)

(56) References Cited

U.S. PATENT DOCUMENTS

| | | |
|---|---|---|
| 2006/0068080 A1 | 3/2006 | Yadav |
| 2006/0208215 A1 | 9/2006 | Metzner |
| 2007/0232501 A1 | 10/2007 | Tonomura |
| 2009/0214767 A1 | 8/2009 | Wang |
| 2009/0315093 A1 | 12/2009 | Li |
| 2011/0263115 A1* | 10/2011 | Ganguli .................. C23C 16/06 438/595 |
| 2011/0269267 A1 | 11/2011 | Fuchigami |
| 2012/0187400 A1* | 7/2012 | Mo .......................... H01L 29/49 257/48 |

OTHER PUBLICATIONS

Hwang Wan Sik; Study of Advanced Gate Stack Using HighK Dielectric and Metal Electrode; ; National University of Singapore (Singapore, SG) ; National University of Singapore.

Gotoh et al.; Measurement of Work Function of Transition Metal Nitride and Carbide Thin Films; Dec. 16, 2002; Department of Electronic Science and Engineering, Kyoto University.

Biswas et al.; Work Function Tuning of Nickel Silicide by CoSputtering Nickel and Silicon; ; AIP Applied Physics Letter.

Jun Yuan et al.; Tunable Work Function in Fully NickelSilicided Polysilicon Gates for Metal Gate MOSFET Applications; ; IEEE.

* cited by examiner

| HfCl₄ Pulse | Liner | Hf | C | Al | O | N | Cl |
|---|---|---|---|---|---|---|---|
| 60s | 50A ALD TiN | 22.8% | 26.3% | 10.3% | 8.5% | 16.9% | 15.1% |
| 60s | None | 15.9% | - | 8.3% | 65.6% | - | 10.2% |
| 10s | 50A ALD TiN | 22% | 35% | 12.5% | - | 10.5% | 20% |
| 10s | None | 17.5% | - | 7.7% | 64.7% | | 10.1% |

FIG. 12

| Split | Mean Vfb (V) | Vfb Std Dev (V) | EWF (eV) |
|---|---|---|---|
| PVD TiN WF | -0.16 | 2e-2 | 4.83 |
| 10% Al HfAlC WF | -0.41 | 4.84e-3 | 4.58 |
| Dep/Anneal 10% Al HfAlC WF | -0.38 | 1.27e-3 | 4.61 |
| Dep/Anneal 10% Al HfAlC WF + Barrier removal | -0.41 | 2.68e-3 | 4.58 |

FIG. 17

ATOMIC LAYER DEPOSITION OF HFALC AS A METAL GATE WORKFUNCTION MATERIAL IN MOS DEVICES

CROSS-REFERENCE TO RELATED APPLICATIONS

This application claims priority to U.S. Provisional Application Ser. No. 61/776,188 filed on Mar. 11, 2013, which is herein incorporated by reference for all purposes. This application claims priority to U.S. Provisional Application Ser. No. 61/805,374 filed on Mar. 26, 2013, which is herein incorporated by reference for all purposes. This application claims priority to U.S. Provisional Application Ser. No. 61/858,921 filed on Jul. 26, 2013, which is herein incorporated by reference for all purposes. This application claims priority to U.S. Provisional Application Ser. No. 61/870,963 filed on Aug. 28, 2013, which is herein incorporated by reference for all purposes.

TECHNICAL FIELD

The present disclosure relates generally to work function materials used in microelectronic devices and methods of forming them.

BACKGROUND

As metal oxide semiconductor field effect transistor (MOSFET) devices are shrinking and moving towards 3-dimensional (3D) structures, such as FinFETs, it is becoming increasingly difficult to use ion implantation to tune the device threshold voltage ($V_{th}$). An alternative method to tune the $V_{th}$ is to use different metals with varying work functions as the gate material in a high-k metal gate (HKMG) structure. In planar device structures the metal gate is typically deposited using physical vapor deposition (PVD), but as device dimensions are shrinking and becoming 3D, atomic layer deposition (ALD) will become necessary to deposit the metal gate in a conformal manner. Metals and compounds such as tantalum-silicon-nitride, ruthenium, tantalum carbide, molybdenum nitride, and titanium aluminide with band-edge work functions have been evaluated as candidates to be used as gate p- and n-metals in MOSFET devices. For Multi-$V_{th}$ integrated circuit (IC) devices, materials with mid-gap work functions are also desired. Nickel silicide, titanium silicide, hafnium carbide, and hafnium aluminide have been found to possess mid-gap work functions. Many of the metal gate materials have been deposited using PVD. However, it is difficult to tune the work function of these materials when deposited using PVD techniques.

Therefore, there is a need to develop new materials and methods for deposition for advanced work function materials used in advanced IC devices.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

As advanced silicon devices are transitioning from planar to 3D structures, new materials and processes are needed to control the device characteristics. ALD of $Hf_xAl_yC_z$ films using hafnium chloride ($HfCl_4$) and Trimethylaluminum (TMA) precursors can be combined with post-deposition anneal processes and ALD liners to control the device characteristics in high-k metal-gate devices. Variation of the $HfCl_4$ pulse time allows for control of the Al % incorporation in the $Hf_xAl_yC_z$ film in the range of 10-13%. Combinatorial process tools can be employed for rapid electrical and materials characterization of various materials stacks. The effective work function (EWF) in metal oxide semiconductor capacitor (MOSCAP) devices with the $Hf_xAl_yC_z$ work function layer coupled with ALD deposited $HfO_2$ high-k gate dielectric layers was quantified to be mid-gap at ~4.6 eV. Thus, $Hf_xAl_yC_z$ is a promising metal gate work function material allowing for the tuning of device threshold voltages ($V_{th}$) for anticipated multi-$V_{th}$ integrated circuit (IC) devices.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 12 presents data for film composition according to some embodiments.

FIG. 17 presents data for flat band voltage and effective work function according to some embodiments.

DETAILED DESCRIPTION

Figure 1:
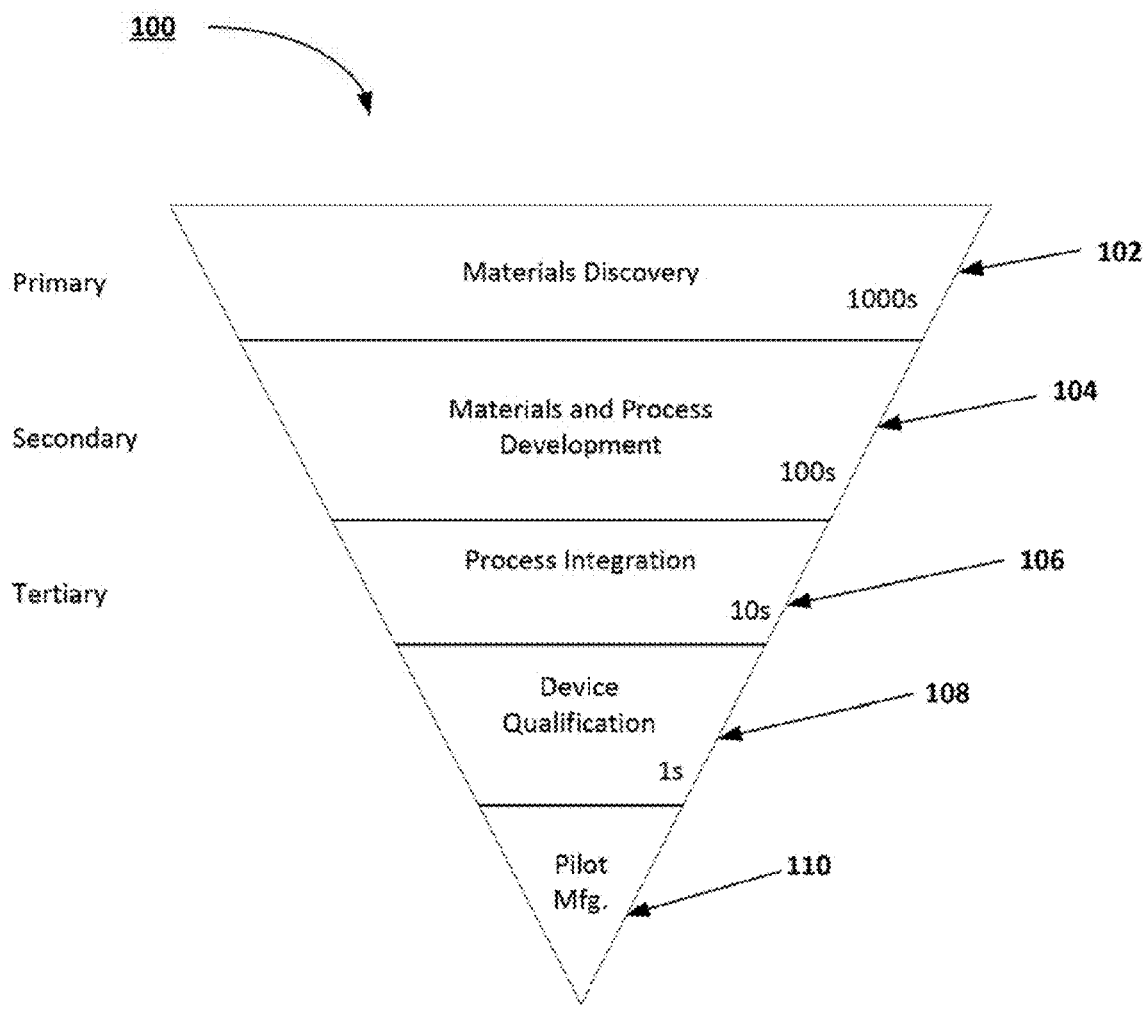
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

Those skilled in the art will appreciate that each of the layers discussed herein and used in the device may be formed using any common formation technique such as physical vapor deposition (PVD), atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), pulsed laser deposition (PLD), or evaporation. Generally, because of the structure and size of the display devices, PVD or PECVD are preferred methods of formation. However, any of these techniques are suitable for forming each of the various layers discussed herein. Those skilled in the art will appreciate that the teachings described herein are not limited by the technology used for the deposition process.

As used herein, the phrase "site-isolated region" (SIR) will be understood to refer to two or more regions defined on a substrate that are separated from each other and used for the evaluation of different materials or process parameters. The SIRs can be formed using many different methods such as scribing, deposition through a shadow mask, deposition using isolated deposition heads, lithography, and the like. The present disclosure is not limited by the method used to form the SIRs.

As used herein, the terms "film" and "layer" will be understood to represent a portion of a stack. They will be understood to cover both a single layer as well as a multi-layered structure (i.e. a nanolaminate). As used herein, these terms will be used synonymously and will be considered equivalent.

The term "substrate" as used herein may refer to any workpiece on which formation or treatment of material layers is desired. Substrates may include, without limitation, silicon, germanium, silicon-germanium alloys, gallium arsenide, indium gallium arsenide, indium gallium antimonide, silica, sapphire, zinc oxide, silicon carbide, aluminum nitride, Spinel, coated silicon, silicon on oxide, silicon carbide on oxide, glass, gallium nitride, indium nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

The manufacture of semiconductor devices entails the integration and sequencing of many unit processing steps. As an example, semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009, the entireties of which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005, the entireties of which are all herein incorporated by reference.

HPC processing techniques have been successfully adapted to wet chemical processing such as etching, texturing, polishing, cleaning, etc. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

Figure 2:
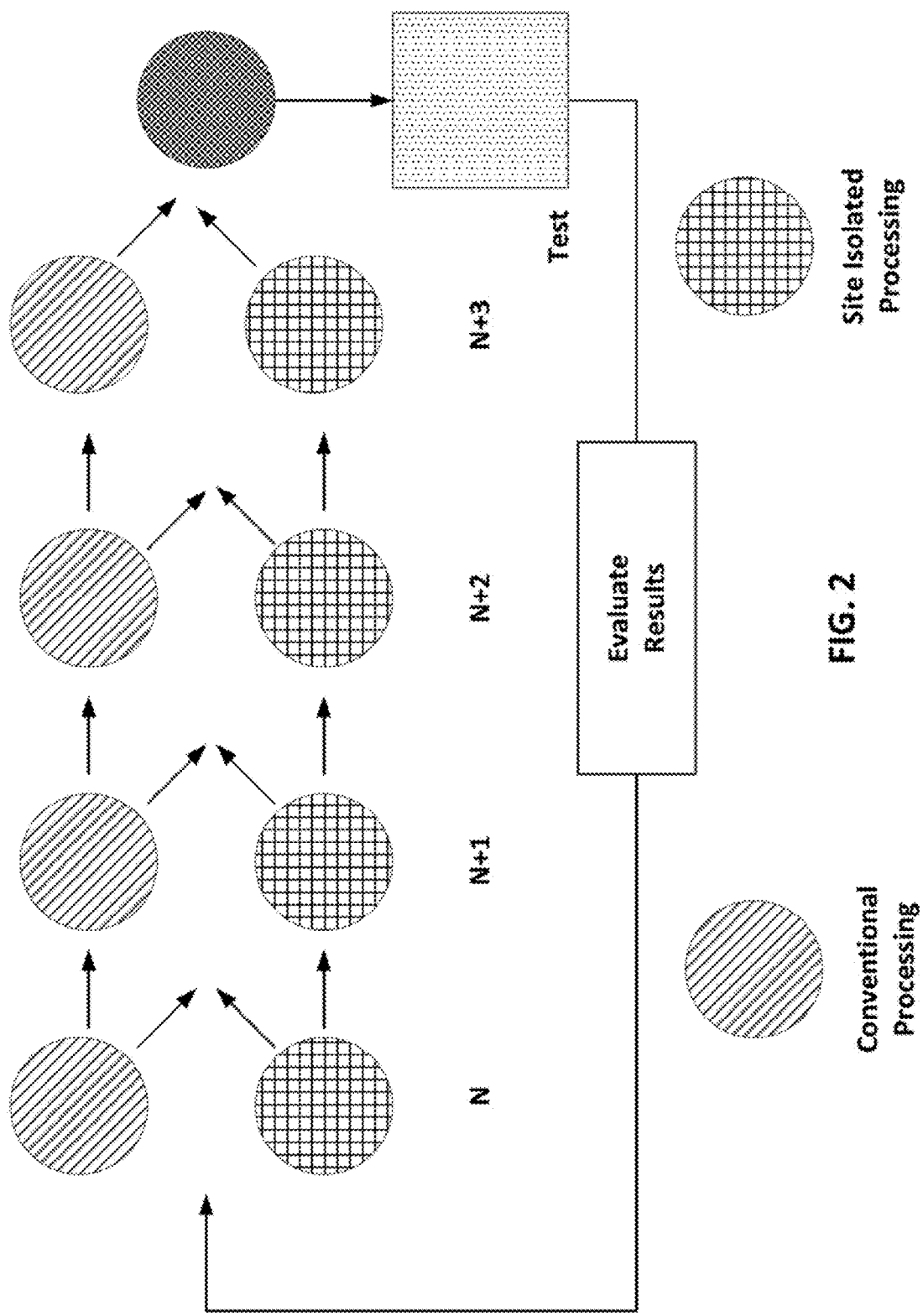
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It will be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It will be appreciated that these process parameters are exemplary and not meant to be an exhaustive list as other process parameters commonly used in semiconductor manufacturing may be varied.

Figure 3:
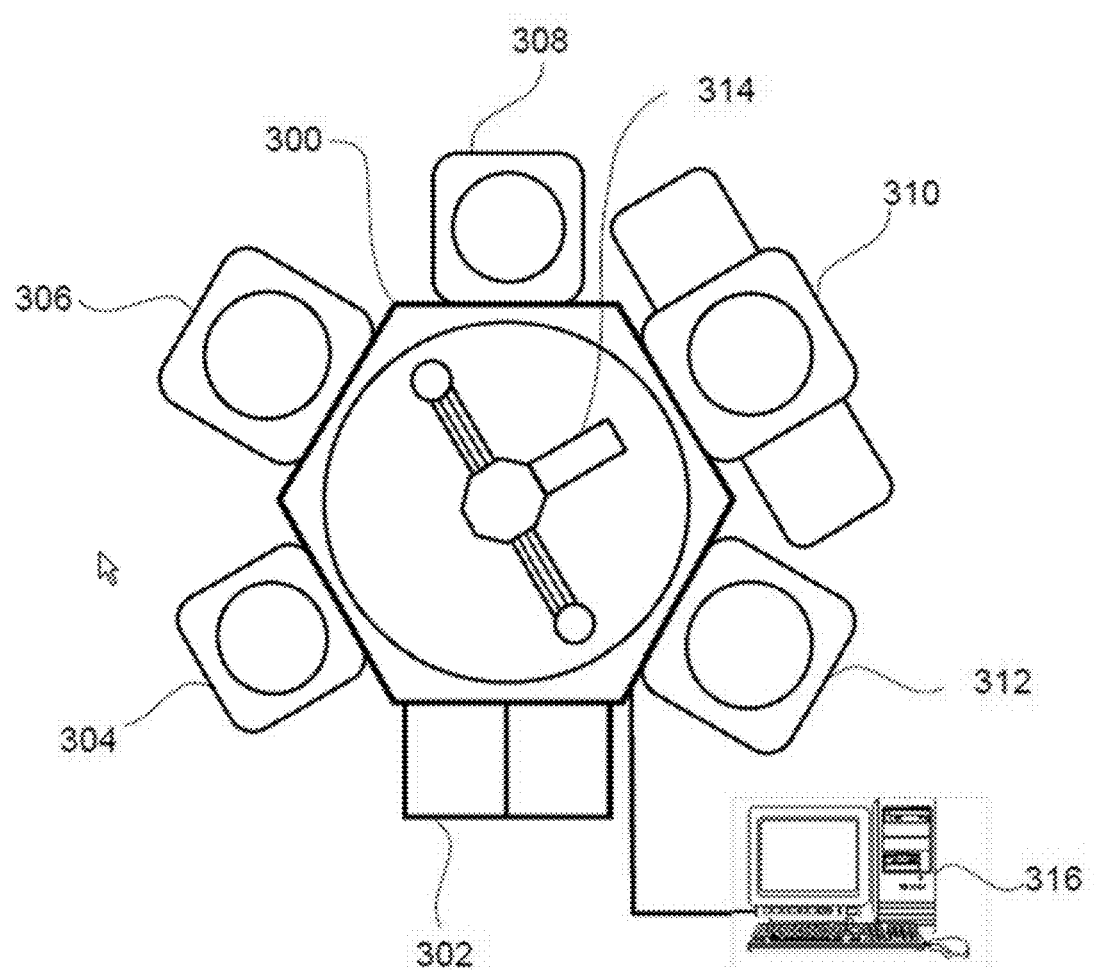
FIG. 3 is a simplified schematic diagram illustrating an integrated high productivity combinatorial (HPC) system.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

In some embodiments, a process chamber for combinatorial processing of a substrate is provided that includes one or more assemblies for sputtering material from targets (such as sputter guns); a power source coupled to the one or more sputter guns; a substrate support; a power source (e.g. RF, DC, pulsed, or the like) coupled to the substrate support; and a grounded shield comprising an aperture disposed between the substrate support and the one or more sputter guns to form a dark-space gap between the substrate support and the aperture. The aperture may be configured to allow sputter deposition or plasma processing of a site-isolated region on the substrate.

The process chamber may further include a plasma confinement ring between the substrate support and the grounded shield. The plasma confinement ring may be thicker than the substrate. The plasma confinement ring fills the dark-space gap between the substrate support and the grounded shield.

The process chamber may further include a dielectric material in the dark-space gap. The dielectric material may be coated with a metal layer for grounding and RF shielding. The dark-space gap may be between about 1 mm and about 3 mm.

The process chamber may further include a controller to selectively apply power to the one or more sputter guns from the power source and apply power to bias the substrate support from a power source. The controller may be configured to control the power source to perform one or both of plasma processing and PVD deposition on a site-isolated region on the substrate. In some embodiments, other sputter mechanisms can be used instead of the sputter guns.

In some embodiments, a semiconductor processing system for combinatorial processing of a substrate is provided that includes a process chamber having a dark-space region configured to prevent plasma leaks in a region adjacent the substrate. The process chamber can be configured to perform both plasma processing and sputter deposition on a site-isolated region on the substrate. The process chamber may include a dielectric material in the dark-space gap. The dark-space region may be between about 1 mm and about 3 mm.

The process chamber may include a plasma confinement ring positioned around the substrate to prevent plasma leak in a region adjacent the substrate. The plasma confinement ring may be thicker than the substrate. The plasma confinement ring may be a conductive material or ceramic material which may or may not be partially coated with a metal layer.

In some embodiments, a method of combinatorial processing of a substrate is provided in which site-isolated sputter deposition and plasma processing are performed in the same process chamber. The site-isolated sputter deposition may include site-isolated co-sputtering deposition. Cleaning, site-isolated sputter deposition, and plasma processing may be performed in the same process chamber. Cleaning, site-isolated sputter deposition, and plasma processing, and full wafer sputter deposition may be performed in the same process chamber.

In some embodiments, a method of combinatorial processing of a substrate is provided in which sputter deposition and plasma processing are performed in the same process chamber. The sputter deposition may include co-sputtering deposition. Cleaning, sputter deposition, and plasma processing may be performed in the same process chamber. The sputter deposition may result in a gradient in material properties across the length and/or width of the substrate. Physical methods such as scribing or lithography may be used to define the SIRs after the deposition.

Figure 4:
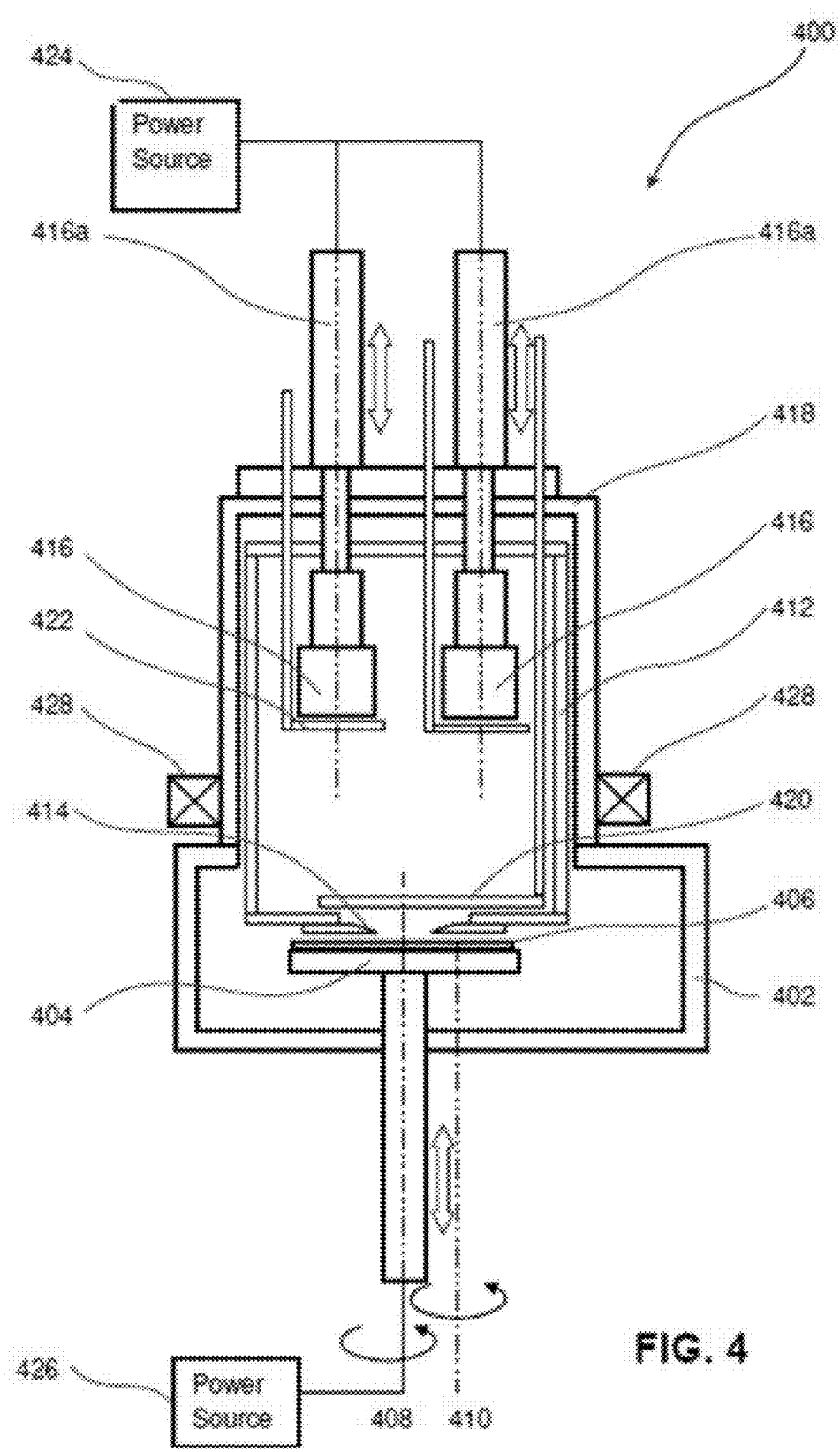
FIG. 4 illustrates a physical vapor deposition (PVD) system according to some embodiments.

FIG. 4 is a simplified schematic diagram illustrating an exemplary process chamber 400 configured to perform combinatorial processing and full substrate processing in accordance with some embodiments of the invention. It will be appreciated that the processing chamber shown in FIG. 4 is merely exemplary and that other process or deposition chambers may be used with the invention. Further details on exemplary deposition chambers that can be used with the invention can be found in U.S. patent application Ser. No. 11/965,689, now U.S. Pat. No. 8,039,052, entitled "Multi-region Processing System and Heads", filed Dec. 27, 2007, and claiming priority to U.S. Provisional Application No. 60/970,500 filed on Sep. 6, 2007, and U.S. patent application Ser. No. 12/027,980, entitled "Combinatorial Process System", filed Feb. 7, 2008 and claiming priority to U.S. Provisional Application No. 60/969,955 filed on Sep. 5, 2007, the entireties of which are hereby incorporated by reference.

The processing chamber 400 includes a bottom chamber portion 402 disposed under a top chamber portion 418. A substrate support 404 is provided within the bottom chamber portion 402. The substrate support 404 is configured to hold a substrate 406 disposed thereon and can be any known substrate support, including but not limited to a vacuum chuck, electrostatic chuck or other known mechanisms. The substrate 406 may be a conventional 200 mm and 300 mm wafers, or any other larger or smaller size. In some embodiments, substrate 406 may be a square, rectangular, or other shaped substrate. The substrate 406 may be a blanket substrate, a coupon (e.g., partial wafer), or even a patterned substrate having predefined regions. In some embodiments, substrate 406 may have regions defined through site-isolated processing as described herein.

The top chamber portion 418 of the chamber 400 includes a process kit shield 412, which defines a confinement region over a portion of the substrate 406. As shown in FIG. 4, the process kit shield 412 includes a sleeve having a base (optionally integrated with the shield) and an optional top. It will be appreciated, however, that the process kit shield 412 may have other configurations. The process kit shield 412 is configured to confine plasma generated in the chamber 400 by sputter guns 416. The positively-charged ions in the plasma strike a target and dislodge atoms from the target. The sputtered neutrals are deposited on an exposed surface of substrate 406. In some embodiments, the process kit shield 412 may be partially moved in and out of chamber 400, and, in other embodiments, the process kit shield 412 remains in the chamber for both full substrate and combinatorial processing. When used in the full substrate configuration, a gradient in the material properties can be introduced across the length and/or width of the substrate.

The base of process kit shield 412 includes an aperture 414 through which a surface of substrate 406 is exposed for deposition processing. The chamber may also include an aperture shutter 420 which is moveably disposed over the base of process kit shield 412. The aperture shutter 420 slides across a bottom surface of the base of process kit shield 412 in order to cover or expose aperture 414. In some embodiments, the aperture shutter 420 is controlled by an arm extension (not shown) which moves the aperture shutter to expose or cover aperture 414.

As shown in FIG. 4, the chamber 400 includes two sputter guns 416. While two sputter guns are illustrated, any number of sputter guns may be included, e.g., one, three, four or more sputter guns may be included. Where more than one sputter gun is included, the plurality of sputter guns may be referred to as a cluster of sputter guns. In addition, other sputter systems can be used, such as magnetron sputter systems.

The sputter guns 416 are moveable in a vertical direction so that one or both of the guns may be lifted from the slots of the shield. In some embodiments, sputter guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc. and the tilt angle may be varied.

The chamber may also include a gun shutter 422, which seals off the deposition gun when the process gun 416 is not needed during processing. The gun shutter 422 allows one or more of the sputter guns 416 to be isolated from certain processes as needed. It will be appreciated that the gun shutter 422 may be integrated with the top of the process kit shield 412 to cover the opening as the process gun 416 is lifted or individual gun shutter 422 can be used for each process gun 416.

The sputter guns 416 may be fixed to arm extensions 416*a* to vertically move sputter guns 416 toward or away from top chamber portion 418. The arm extensions 416*a* may be attached to a drive, e.g., lead screw, worm gear, etc. The arm extensions 416*a* may be pivotally affixed to sputter guns 416 to enable the sputter guns to tilt relative to a vertical axis. In some embodiments, sputter guns 416 tilt toward aperture 414 when performing combinatorial processing and tilt toward a periphery of the substrate being processed when performing full substrate processing. It will be appreciated that sputter guns 416 may alternatively tilt away from aperture 414.

The chamber 400 also includes power sources 424 and 426. Power source 424 provides power for sputter guns 416, and power source 426 provides RF power to bias the substrate support 404. In some embodiments, the output of the power source 426 is synchronized with the output of power source 424. The power source, 424, may output a direct current (DC) power supply, a direct current (DC) pulsed power supply, a radio frequency (RF) power supply or a DC-RF imposed power supply. The power sources 424 and 426 may be controlled by a controller (not shown) so that both deposition and etch can be performed in the chamber 400, as will be described in further detail hereinafter.

The chamber 400 may also include an auxiliary magnet 428 disposed around an external periphery of the chamber 400. The auxiliary magnet 428 is located between the bottom surface of sputter guns 416 and proximity of a substrate support 404. The auxiliary magnet may be positioned proximate to the substrate support 404, or, alternatively, integrated within the substrate support 404. The magnet 428 may be a permanent magnet or an electromagnet. In some embodiments, the auxiliary magnet 428 improves ion guidance as the magnetic field above substrate 406 is re-distributed or optimized to guide the metal ions. In some other embodiments, the auxiliary magnet 428 provides more uniform bombardment of ions and electrons to the substrate and improves the uniformity of the film being deposited.

The substrate support 404 is capable of both rotating around its own central axis 408 (referred to as "rotation" axis), and rotating around an exterior axis 410 (referred to as "revolution" axis). Such dual rotary substrate supports can be advantageous for combinatorial processing using site-isolated mechanisms. Other substrate supports, such as an XY table, can also be used for site-isolated deposition. In addition, substrate support 404 may move in a vertical direction. It will be appreciated that the rotation and movement in the vertical direction may be achieved through one or more known drive mechanisms, including, for example, magnetic drives, linear drives, worm screws, lead screws, differentially pumped rotary feeds, and the like.

Through the rotational movement of the process kit shield 412 and the corresponding aperture 414 in the base of the process kit shield, in combination with the rotational movement of substrate support 404, any region of a substrate 406 may be accessed for combinatorial processing. The dual rotary substrate support 404 allows any region (i.e., location or site) of the substrate 406 to be placed under the aperture 414; hence, site-isolated processing is possible at any location on the substrate 406. It will be appreciated that removal of the aperture 414 and aperture shutter 420 from the chamber 400 or away from the substrate 406 and enlarging the bottom opening of the process kit shield 412 allows for processing of the full substrate.

As described above, embodiments of the invention allow for both sputter deposition and plasma etch to be performed in the same process chamber (e.g., chamber 400). In some embodiments of the invention, the chamber 400 is configured so that both sputter deposition and plasma etch can be performed in the chamber 400, and, in particular, the chamber 400 is configured to allow for both site-isolated sputter deposition and plasma etch to be performed in the chamber.

It will be appreciated that full wafer sputter deposition and plasma etch may also be performed in the chamber 400 by removing the aperture 414 away from the chamber 400 or moving the aperture 414 away from the substrate 406 and enlarging the bottom opening of the process kit shield 412.

In particular, plasma etch may be performed in the chamber 400 by applying RF power from the power source 426 to bias the substrate support (e.g., an electrostatic chuck) 404 with or without DC plasma near the sputter target. Plasma is then ignited on top of the substrate 406, which is confined by the aperture 414 and shield 412 above the substrate 406 so that site-isolated plasma etch of the substrate 406 can occur in the chamber 400. Sputter deposition may similarly be performed in the chamber 400 by applying DC power from the power source 424 to the sputter gun(s) 416. Three modes of processing can be performed in chamber 400: sputter deposition only, simultaneous sputter deposition and plasma etch, and plasma etch only.

In one embodiment, the RF power is any value or range of values between about 50 W and about 2000 W. In some embodiments, DC or pulsed DC power applied to sputter sources can have peak powers as high as 10 kW, for example, for high metal ionization in sputter deposition. The RF power frequency may be any value or range of values between about 40 kHz and about 60 MHz. It will be appreciated that the RF power frequency may be less than about 40 kHz or greater than about 60 MHz.

In chamber 400, plasma etch can be used to clean the substrate 406. An exemplary process according to some embodiments of the invention may begin by cleaning the substrate, performing site-isolated sputter deposition, performing site-isolated plasma etch, performing full substrate sputter deposition and then performing a subsequent full substrate plasma etch, all within the same chamber (e.g., chamber 400). Another exemplary process according to some embodiments of the invention may begin by cleaning the substrate, performing a full substrate sputter deposition, performing site-isolated sputter deposition, performing site-isolated plasma etch, performing full substrate sputter deposition, and performing a subsequent full substrate plasma etch, all within the same chamber (e.g., chamber 400). It will be appreciated that the above processes are merely exemplary and that processes according to the invention may include fewer steps or additional steps and that the order of the steps may vary.

Hafnium oxide is a candidate for silicon dioxide replacement as a gate dielectric material. It has a dielectric constant of about 25 at room temperature or about six times greater than that of silicon dioxide. While this dielectric constant is more than an order of magnitude smaller than for strontium titanium oxide ($SrTiO_3$), which has a dielectric constant of about 300, hafnium oxide has a conduction band offset of about 1.5-2.0 eV with respect to silicon, which is more than one order of magnitude higher than that of strontium titanium oxide.

The same properties of hafnium oxide that make it a leading candidate for a gate dielectric application also give hafnium oxide a high potential for other applications, such as insulating dielectrics in capacitive elements of various memory devices or, more specifically, of dynamic random-access memory (DRAM) capacitor stacks. Because of its high dielectric constant, a thick layer of hafnium oxide can be used to achieve the same performance as a much thinner silicon dioxide layer. However, thicker hafnium oxide layers have much lower leakage currents in comparison with thinner silicon oxide layers. In addition to having a high dielectric constant, hafnium oxide is thermodynamically stable with respect to silicon, with which it may be in contact in many semiconductor applications. Many modern complementary metal-oxide-semiconductor (CMOS) and DRAM processes involve high temperatures (e.g., 1000° C.) that are applied to substrates for a few seconds. Other applications of hafnium oxide include optical coatings, catalysts, and protective coatings (due to its hardness and thermal stability).

Hafnium oxide layers or structures may be deposited by a variety of physical vapor deposition (PVD) methods, including laser pulse ablation and sputtering. Other deposition techniques include CVD using β-diketonate precursors, alkoxide precursors, and chloride precursors. Atomic layer deposition (ALD) techniques may be used to prepare layers using both chloride and iodide precursors. Different deposition techniques yield different layer structures that may have different susceptibilities to etching.

Metal layers may be converted to metal compounds by the reaction with ions or reactive neutral species to form metal oxides, metal nitrides, metal carbides, metal silicides, metal chlorides, metal fluorides, and the like. These metal compounds may be used as diffusion barriers, local conductors, adhesion layers, work function (WF) tuning layers, and the like. The ions and/or reactive neutral species may be formed using a remote plasma source.

Figure 5:
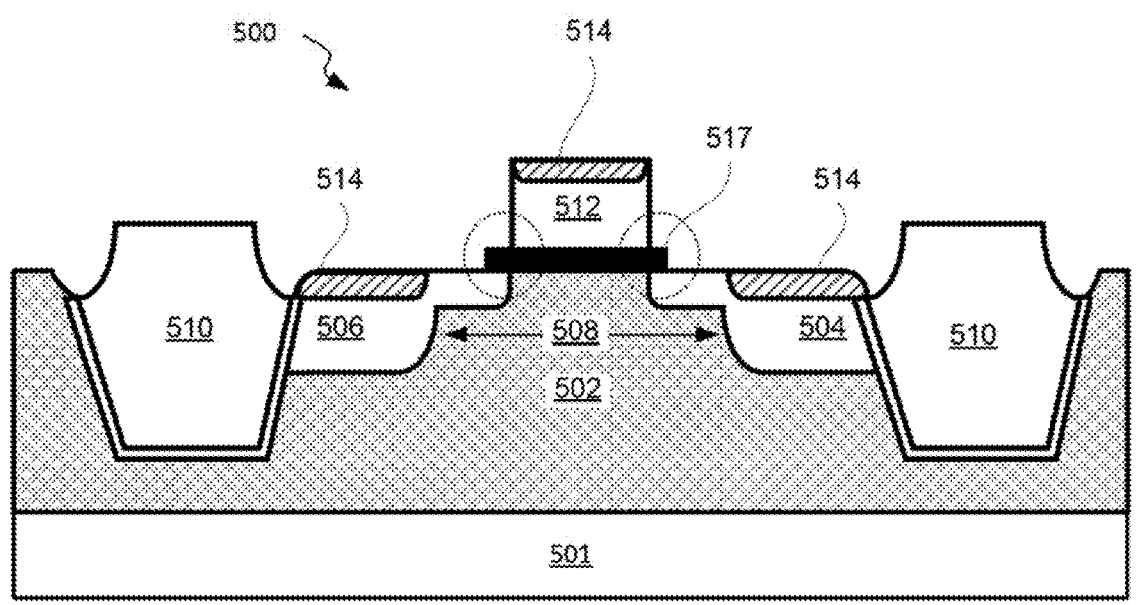
FIG. 5 is a simplified schematic diagram illustrating a cross section of a device according to some embodiments.

A brief description of semiconductor device examples is presented below to provide better understanding of various plasma surface treatments. Specifically, FIG. 5 illustrates a schematic representation of substrate portions including MOS device, 500, in accordance with some embodiments. The references below are made to positive metal-oxide semiconductor (PMOS) devices but other types of MOS devices can be used in the described processes and will be understood by one having ordinary skill in the art. MOS device 500 includes a p-doped substrate, 501, and an n-doped well, 502, disposed within substrate, 501. Substrate, 501, is typically a part of an overall wafer that may include other devices. Some of these devices may include silicon nitride, silicon oxide, polysilicon, or titanium nitride structures. P-doped substrate, 501, may include any suitable p-type dopants, such as boron and indium, and may be formed by any suitable technique. N-doped well, 502, may include any suitable n-type dopants, such as phosphorus and arsenic, and may be formed by any suitable technique. For example, n-doped well, 502, may be formed by doping substrate, 501, by ion implantation, for example.

MOS device, 500, also includes a conductive gate electrode, 512, that is separated from n-doped well, 502, by gate dielectric, 517. Gate electrode, 512, may include any suitable conductive material. In some embodiments, gate electrode, 512, may comprise polysilicon. In some embodiments, gate electrode, 512, may include polysilicon doped with a p-type dopant, such as boron. Gate dielectric, 517, is formed from a high-k material (e.g. hafnium oxide). Other dielectric materials include zirconium oxide or aluminum oxide. Typically, a semiconductor material with high mobility such as germanium or a silicon-germanium alloy (not shown) is formed beneath the gate dielectric.

MOS device, 500, also includes p-doped source region, 504, and drain region, 506, (or simply the source and drain) disposed in n-doped well, 502. Source, 504, and drain, 506, are located on each side of gate electrode, 512, forming channel, 508, within n-doped well, 502. Source, 504, and drain, 506, may include a p-type dopant, such as boron. Source, 504, and drain, 506, may be formed by ion implantation. After forming source, 504, and drain, 506, MOS device, 500, may be subjected to an annealing and/or thermal activation process.

In some embodiments, source, 504, drain, 506, and gate electrode, 512, are covered with a layer of self-aligned silicide portions, 514, which may be also referred to as salicide portions or simply salicides. For example, a layer of cobalt may be deposited as a blanket layer and then thermally treated to form these silicide portions, 514. Other suitable materials include nickel and other refractory metals, such as tungsten, titanium, platinum, and palladium. After forming the blanket layer from the suitable metal, the layer is subjected to rapid thermal process (RTP) to react the metal with silicon contained within gate electrode, 512, as well as within source, 504, and drain, 506, to form a metal silicide. The RTP process may be performed at 700° C. to 1000° C.

MOS device, 500, may also include shallow trench isolation (STI) structures, 510, disposed on both sides of source, 504, and drain, 506. STI structures, 510, may include liners formed on the side and bottom walls by, for example, thermal oxidation of silicon of n-doped well, 502. The main body of STI structures is formed by filling a trench within n-doped well, 502, with a dielectric material, such as silicon oxide. Silicon oxide may be filled using high density plasma (HDP) deposition process.

As shown in FIG. 5, gate dielectric, 517, may protrude beyond gate electrode, 512. As such, gate dielectric, 517, may need to be partially etched such that it does not extend past electrode, 512, and does not interfere with subsequent formation of liners and spacers on sidewalls of gate electrode, 512.

In some embodiments, $Hf_xAl_yC_z$ was deposited in an ALD single-wafer chamber with gas delivery through a showerhead above 300 mm diameter silicon wafers. Depositions were performed at substrate temperatures of about 270 C. Hafnium Chloride ($HfCl_4$) and Trimethylaluminum (TMA) precursors were used, with the $HfCl_4$ bubbler heated to about 160 C and the TMA bubbler maintained at room temperature. $HfCl_4$ was delivered into the chamber using Ar carrier gas, and TMA was delivered using a vapor draw method, without the use of a carrier gas. $HfCl_4$ pulse times in the range of 10-60 s were used, while the TMA pulse times were typically about 1 s. Ar was used to purge the chamber after each of the $HfCl_4$ and TMA pulses during the ALD cycles.

After the ALD $Hf_xAl_yC_z$ deposition, the substrate was transferred (with minimum queue time to minimize the exposure of the $Hf_xAl_yC_z$ film to air) to a single-wafer chamber used to deposit titanium nitride using an ALD process. $TiCl_4$ and $NH_3$ were used as precursors and reactants to deposit the titanium nitride liner layer at a substrate temperature of about 375 C (300-550 C). In-situ vacuum, Ar, or $NH_3$ anneal treatments were performed for between 5 to 10 minutes in the ALD TiN chamber at the same substrate temperature as the ALD TiN deposition temperature or annealed in a separate chamber.

The films were characterized using X-Ray Fluorescence (XRF), Spectroscopic Ellipsometry, X-Ray Diffraction (XRD), X-Ray Reflectivity (XRR), and Atomic Force Microscopy (AFM), and Rutherford Back Scattering (RBS). RBS and XRF were used to provide film composition, the crystal structure was characterized using XRD, and AFM was used to characterize the surface roughness. Thicknesses were measured using XRR, Ellipsometry, and XRF measurements, where the XRF counts were calibrated to ellipsometer thickness measurements to calculate XRF thicknesses.

The resistivity of the films was characterized by depositing 300 Å $Hf_xAl_yC_z$ films on 3 kÅ thermal oxide, followed by 20-50 Å ALD TiN liner deposition on top of the $Hf_xAl_yC_z$ films. The sheet resistance (Rs) of the stack was measured and the resistivity of the $Hf_xAl_yC_z$ films was calculated using the known Rs of the ALD TiN liner films and knowing the thickness of each of the $Hf_xAl_yC_z$ and TiN films.

Figure 6:
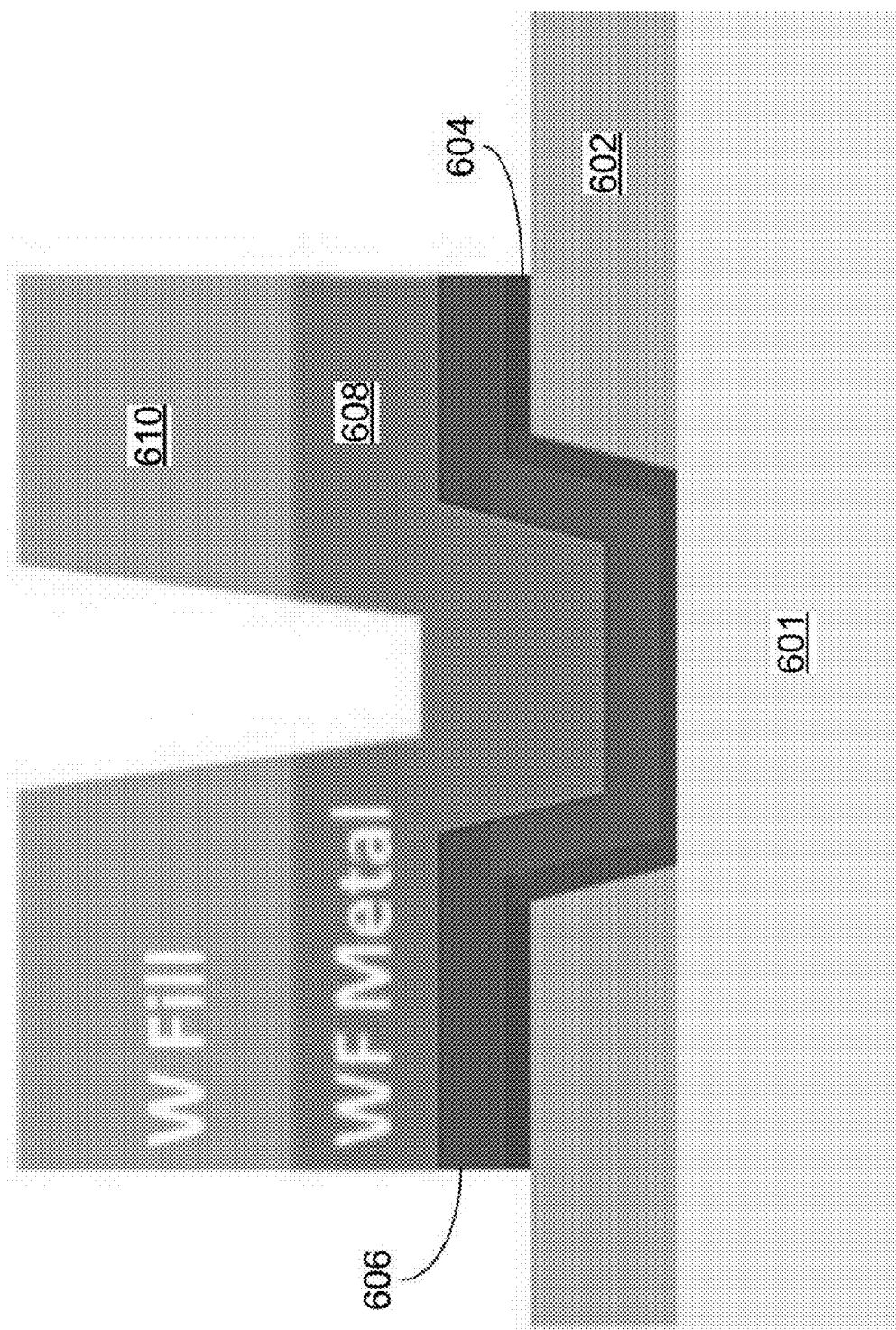
FIG. 6 is a simplified schematic diagram illustrating a cross section of a device according to some embodiments.

FIG. 6 illustrates simple MOSCAP devices prepared for determining electrical performance of the stacks. P-type silicon substrates, 601, were used, and the device features formed within the thermal oxide layer, 602, were defined using typical photolithography and etch processes. $HfO_2$ layers, 604, deposited using ALD were used as the high-k dielectric material, followed by a thin titanium nitride barrier layer, 606, deposited before the $Hf_xAl_yC_z$ and/or titanium nitride work function metal layers, 608, were deposited. The work function layers may include a single layer or may include multiple layers. The $Hf_xAl_yC_z$ layers had the titanium nitride liner layers deposited on top for adhesion and to protect against oxidation. Tungsten layers, 610, were deposited above the work function metal layers to allow for the probe contacts during testing. Other layers such as adhesion and/or barrier layers (not shown) may also be included in the stack. Prior to electrical testing, the MOSCAP devices underwent a forming gas anneal at temperatures up to 500 C.

Figure 7:
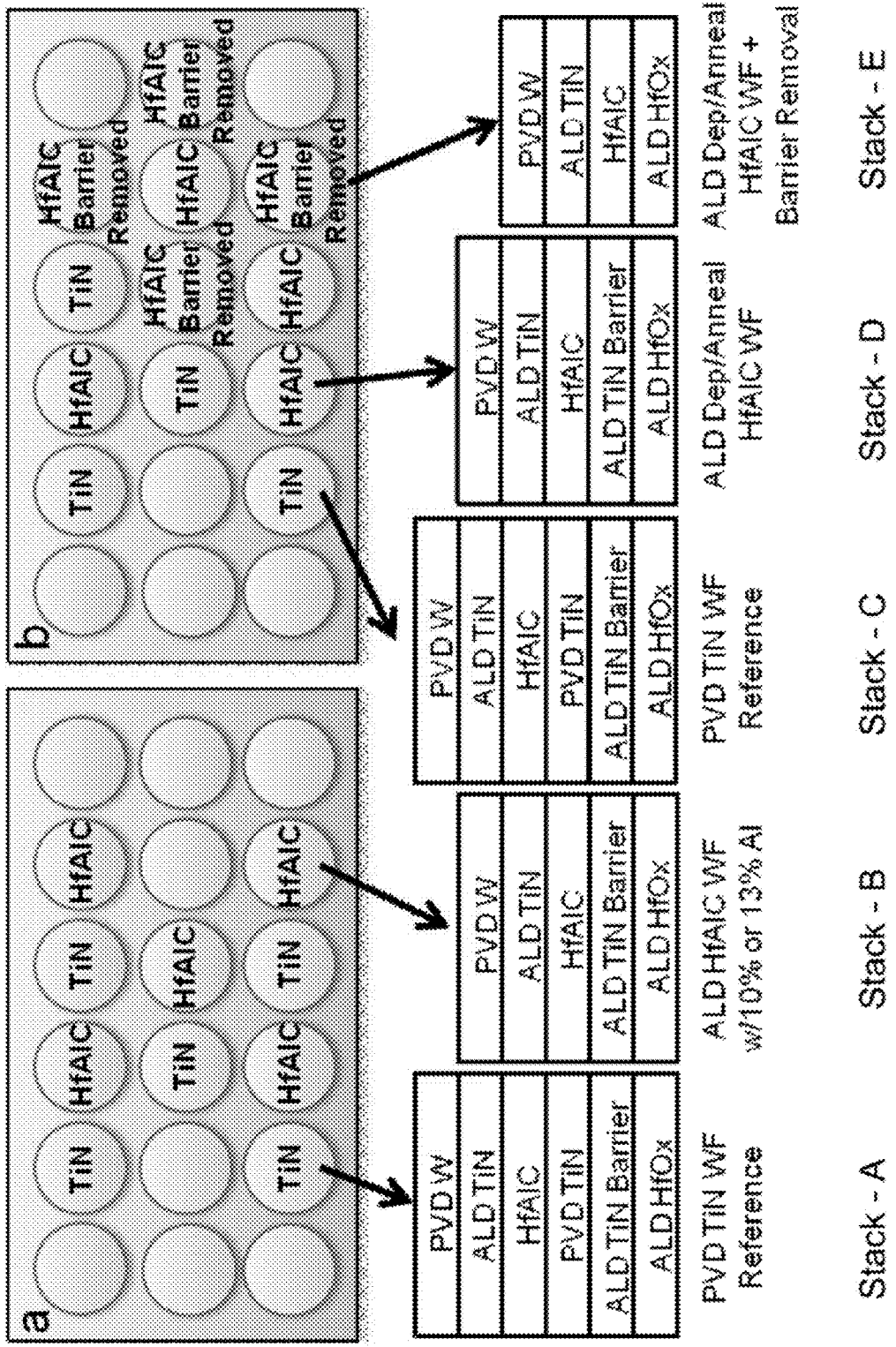
FIG. 7 is a simplified schematic diagram illustrating a design of experiments according to some embodiments.

In some embodiments, High Productivity Combinatorial (HPC) platforms for site-isolated wet etching and PVD deposition are used and multiple experiments can be performed on each substrate for faster cycles-of-learning. In some embodiments, the substrate is a full wafer. In some embodiments, the substrate is a coupon (e.g. a small portion of a wafer). FIG. 7 schematically illustrates how isolated sites on each of two MOSCAP substrates (e.g. coupon a or b) are created, and that a different materials stack (e.g. stacks A-E) can be fabricated as a distinct experimental split.

In Stack—A, a high-k dielectric layer of $HfO_x$ is deposited on an active region of "coupon a" using an ALD process as discussed previously. A titanium nitride barrier layer is deposited above the $HfO_x$ high-k dielectric layer using an ALD process as discussed previously. A titanium nitride work function metal layer is deposited above the titanium nitride barrier layer using a PVD process as discussed previously. A $Hf_xAl_yC_z$ work function metal layer is deposited above the titanium nitride work function metal layer using an ALD process as discussed previously. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously. Stack—A may be repeated in several of the site-isolated regions to allow the repeatability and uniformity of the processes and measured results to be determined.

In Stack—B, a high-k dielectric layer of $HfO_x$ is deposited on an active region of "coupon a" using an ALD process as discussed previously. A titanium nitride barrier layer is deposited above the $HfO_x$ high-k dielectric layer using an ALD process as discussed previously. A $Hf_xAl_yC_z$ work function metal layer is deposited above the titanium nitride barrier layer using an ALD process as discussed previously. The aluminum concentration in the $Hf_xAl_yC_z$ work function metal layer can be varied in a range between 10 atomic % and 13 atomic among the various site-isolated regions. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously. Stack—B may be repeated in several of the site-isolated regions to allow the repeatability and uniformity of the processes and measured results to be determined.

In Stack—C, a high-k dielectric layer of HfO$_x$ is deposited on an active region of "coupon b" using an ALD process as discussed previously. A titanium nitride barrier layer is deposited above the HfO$_x$ high-k dielectric layer using an ALD process as discussed previously. A titanium nitride work function metal layer is deposited above the titanium nitride barrier layer using a PVD process as discussed previously. A Hf$_x$Al$_y$C$_z$ work function metal layer is deposited above the titanium nitride work function metal layer using an ALD process as discussed previously. A titanium nitride adhesion layer is deposited above the Hf$_x$Al$_y$C$_z$ work function metal layer using an ALD process as discussed previously. A tungsten layer is deposited above the titanium nitride adhesion layer using a PVD process as discussed previously. Stack—C may be repeated in several of the site-isolated regions to allow the repeatability and uniformity of the processes and measured results to be determined.

In Stack—D, a high-k dielectric layer of HfO$_x$ is deposited on an active region of "coupon b" using an ALD process as discussed previously. A titanium nitride barrier layer is deposited above the HfO$_x$ high-k dielectric layer using an ALD process as discussed previously. A Hf$_x$Al$_y$C$_z$ work function metal layer is deposited above the titanium nitride barrier layer using an ALD process as discussed previously. ALD deposition parameters can be varied among the various site-isolated regions during the deposition of the Hf$_x$Al$_y$C$_z$ work function metal layers. A titanium nitride adhesion layer is deposited above the Hf$_x$Al$_y$C$_z$ work function metal layer using an ALD process as discussed previously. A tungsten layer is deposited above the titanium nitride adhesion layer using a PVD process as discussed previously. Stack—D may be repeated in several of the site-isolated regions to allow the repeatability and uniformity of the processes and measured results to be determined.

In Stack—E, a high-k dielectric layer of HfO$_x$ is deposited on an active region of "coupon b" using an ALD process as discussed previously. A Hf$_x$Al$_y$C$_z$ work function metal layer is deposited above the HfO$_x$ high-k dielectric layer using an ALD process as discussed previously. ALD deposition parameters can be varied among the various site-isolated regions during the deposition of the Hf$_x$Al$_y$C$_z$ work function metal layers. A titanium nitride adhesion layer is deposited above the Hf$_x$Al$_y$C$_z$ work function metal layer using an ALD process as discussed previously. A tungsten layer is deposited above the titanium nitride adhesion layer using a PVD process as discussed previously. Stack—E may be repeated in several of the site-isolated regions to allow the repeatability and uniformity of the processes and measured results to be determined.

Figure 8:
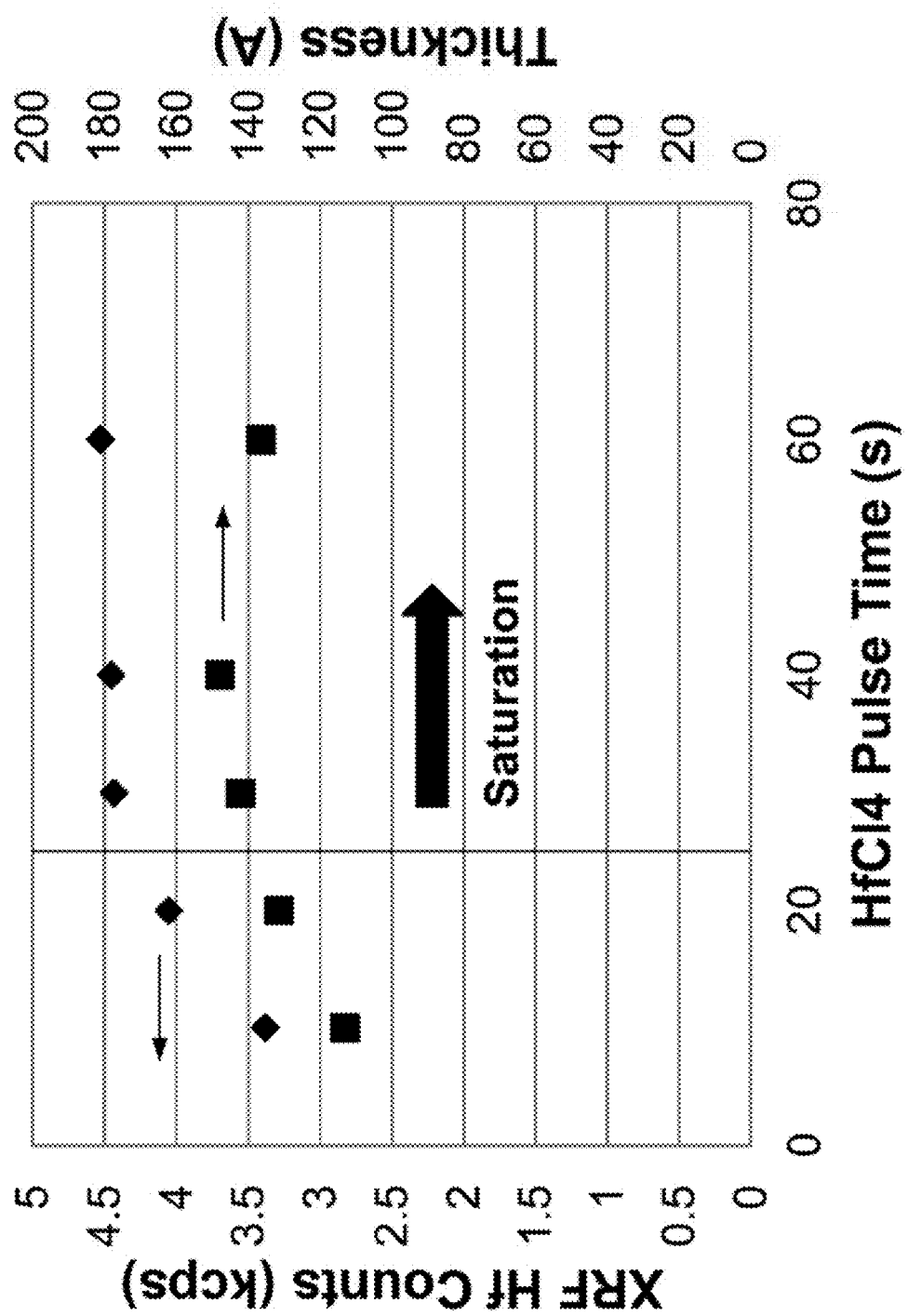
FIG. 8 presents data for XRF Hf counts and thickness versus $HfCl_4$ pulse time according to some embodiments.
Figure 9:
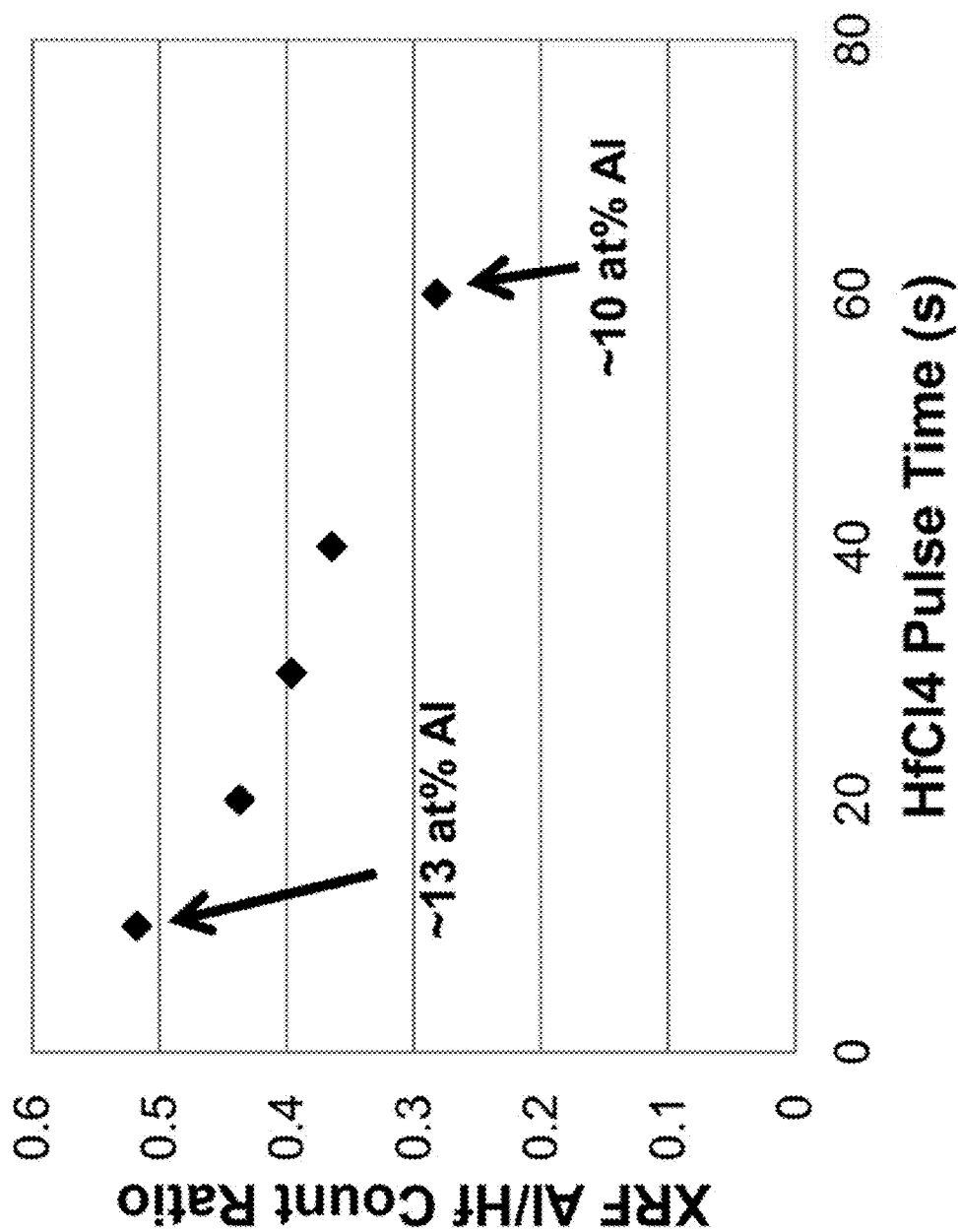
FIG. 9 presents data for XRF Al/Hf count ratio versus $HfCl_4$ pulse time according to some embodiments.

FIG. 8 presents data that illustrate the ALD growth behavior of Hf$_x$Al$_y$C$_z$ as a function of HfCl$_4$ precursor pulse times. Plotted in FIG. 8 are XRF hafnium raw counts (kilo-cycles per second—kcps) on the left y-axis and Hf$_x$Al$_y$C$_z$ film thickness in angstroms on the right y-axis. The data presented in FIG. 8 indicate that 40 seconds of HfCl$_4$ precursor pulse time is sufficient for ALD saturation (e.g. the thickness does not continue to change for longer pulse times). FIG. 9 plots the XRF raw counts of aluminum normalized by the hafnium raw counts. The data in FIG. 9 indicate that as the HfCl$_4$ pulse time is increased, the aluminum concentration in the film decreases. The concentration of aluminum was varied within a range between 10 atomic % and 13 atomic % by adjusting the HfCl$_4$ pulse time. The composition of Al can be changed by varying other process parameters such as temperature or pressure. Without being limited by any particular theory, it is believed that the longer pulse times of the HfCl$_4$ precursor allows more of the active sites on the substrate surface to be blocked, thereby limiting the number of sites available for the deposition of the aluminum species. The concentration of aluminum was confirmed by RBS measurements of the film compositions.

Figure 10:
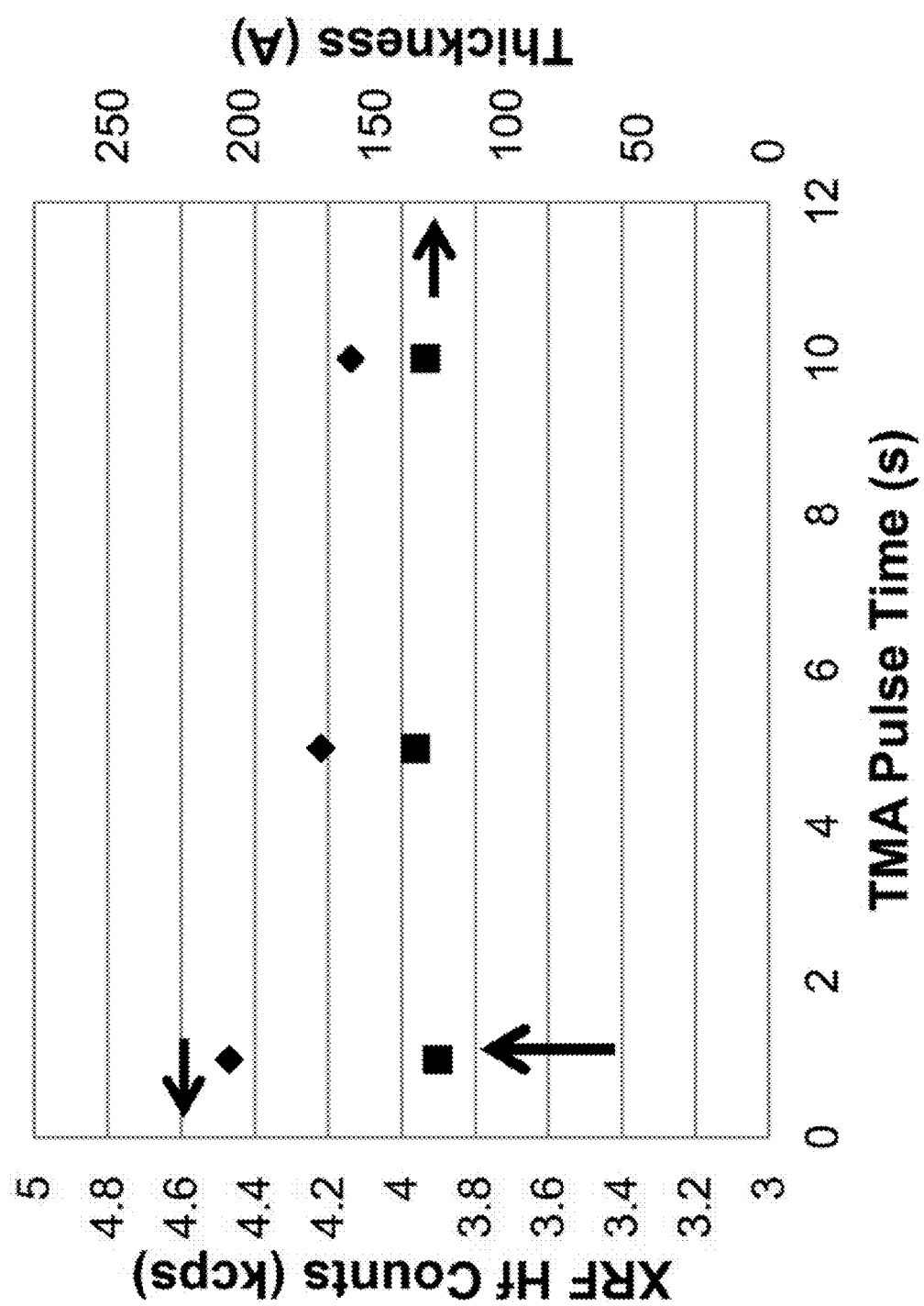
FIG. 10 presents data for XRF Hf counts and thickness versus TMA pulse time according to some embodiments.
Figure 11:
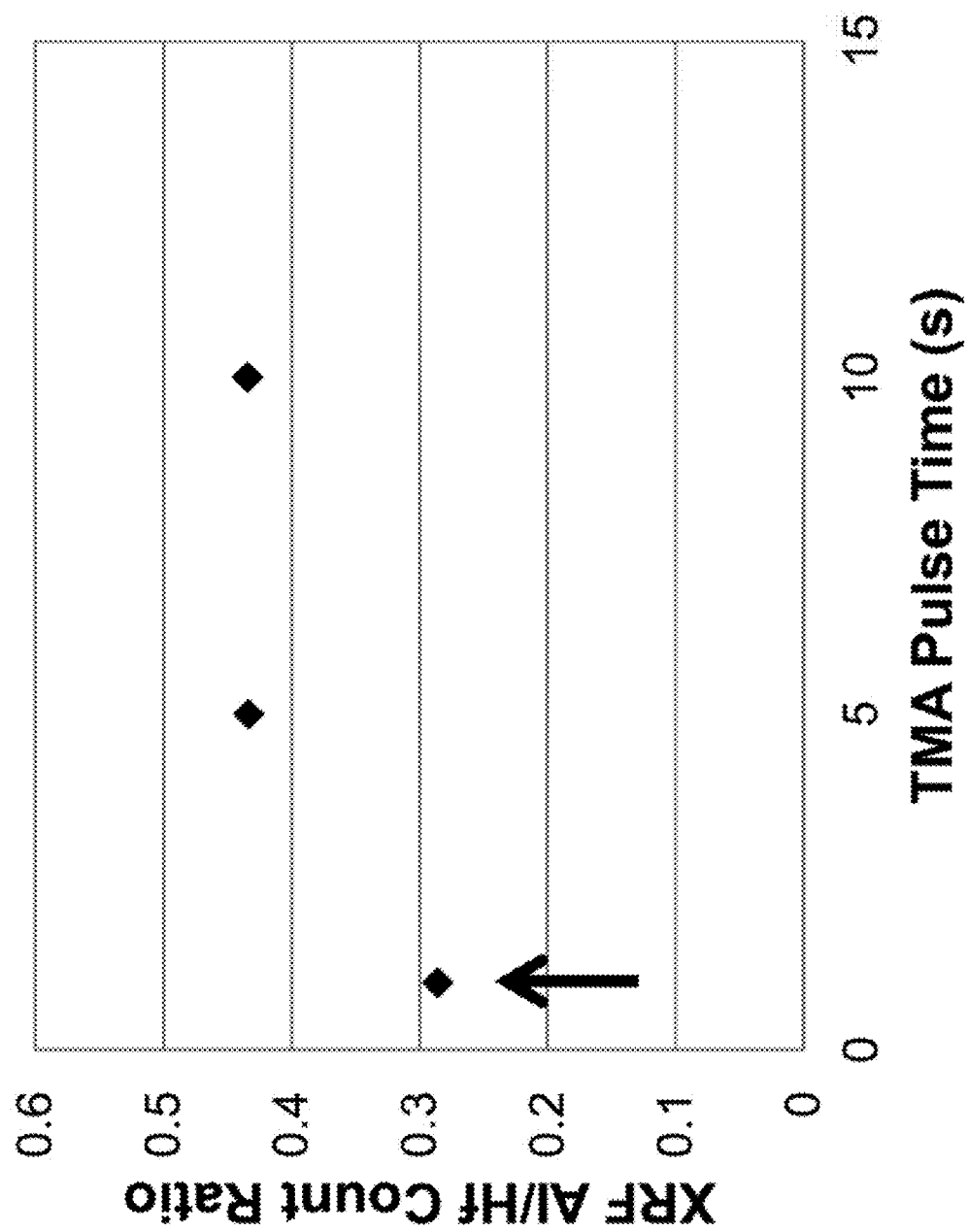
FIG. 11 presents data for XRF Al/Hf count ratio versus TMA pulse time according to some embodiments.

FIG. 10 presents data that illustrate the ALD growth behavior of Hf$_x$Al$_y$C$_z$ as a function of TMA precursor pulse times. Plotted in FIG. 10 are XRF hafnium raw counts (kilo-cycles per second—kcps) on the left y-axis and Hf$_x$Al$_y$C$_z$ film thickness in angstroms on the right y-axis. The data presented in FIG. 10 indicate that 1 second of TMA precursor pulse time is sufficient for ALD saturation (e.g. the thickness does not continue to change for longer pulse times). FIG. 11 plots the XRF raw counts of aluminum normalized by the hafnium raw counts. The aluminum concentration is not a strong function of the TMA pulse times, as seen in FIG. 11. Therefore, the HfCl$_4$ pulse time can be used to vary the aluminum concentration in the Hf$_x$Al$_y$C$_z$ films.

The titanium nitride adhesion layer deposited above the Hf$_x$Al$_y$C$_z$ work function metal layer using an ALD process discussed previously provides enhanced adhesion between the Hf$_x$Al$_y$C$_z$ work function metal layer and the electrodes used for electrical testing. An alternative method for enhancing the adhesion to the Hf$_x$Al$_y$C$_z$ work function metal layer includes incorporating a series of vacuum anneal steps within the deposition process of the Hf$_x$Al$_y$C$_z$ work function metal layer. As an example, about 10 A of the Hf$_x$Al$_y$C$_z$ work function metal layer can be deposited followed by a vacuum anneal (e.g. about 5 minutes). This sequence can be repeated 5 times to yield a Hf$_x$Al$_y$C$_z$ work function metal layer with a thickness of about 50 A.

The titanium nitride adhesion layer deposited above the Hf$_x$Al$_y$C$_z$ work function metal layer using an ALD process discussed previously provides additional benefits. This layer also acts as a diffusion barrier to prevent oxidation of the Hf$_x$Al$_y$C$_z$ work function metal layer. FIG. 12 presents compositional data determined using RBS after about one week of exposure to ambient air. Data is presented for samples deposited using 60 second HfCl$_4$ pulses and samples deposited using 60 second HfCl$_4$ pulses. Data is presented for samples that included the titanium nitride adhesion layer and samples that did not include the titanium nitride adhesion layer. As discussed previously, the samples deposited using the longer HfCl$_4$ pulse time exhibited lower aluminum concentration. The samples that included the titanium nitride adhesion layer contained low levels of oxygen and carbon was present as expected. The samples that did not include the titanium nitride adhesion layer contained very high levels of oxygen and the carbon was not detected. These data indicate the effectiveness of the titanium nitride adhesion layer as an oxygen diffusion barrier.

Figure 13:
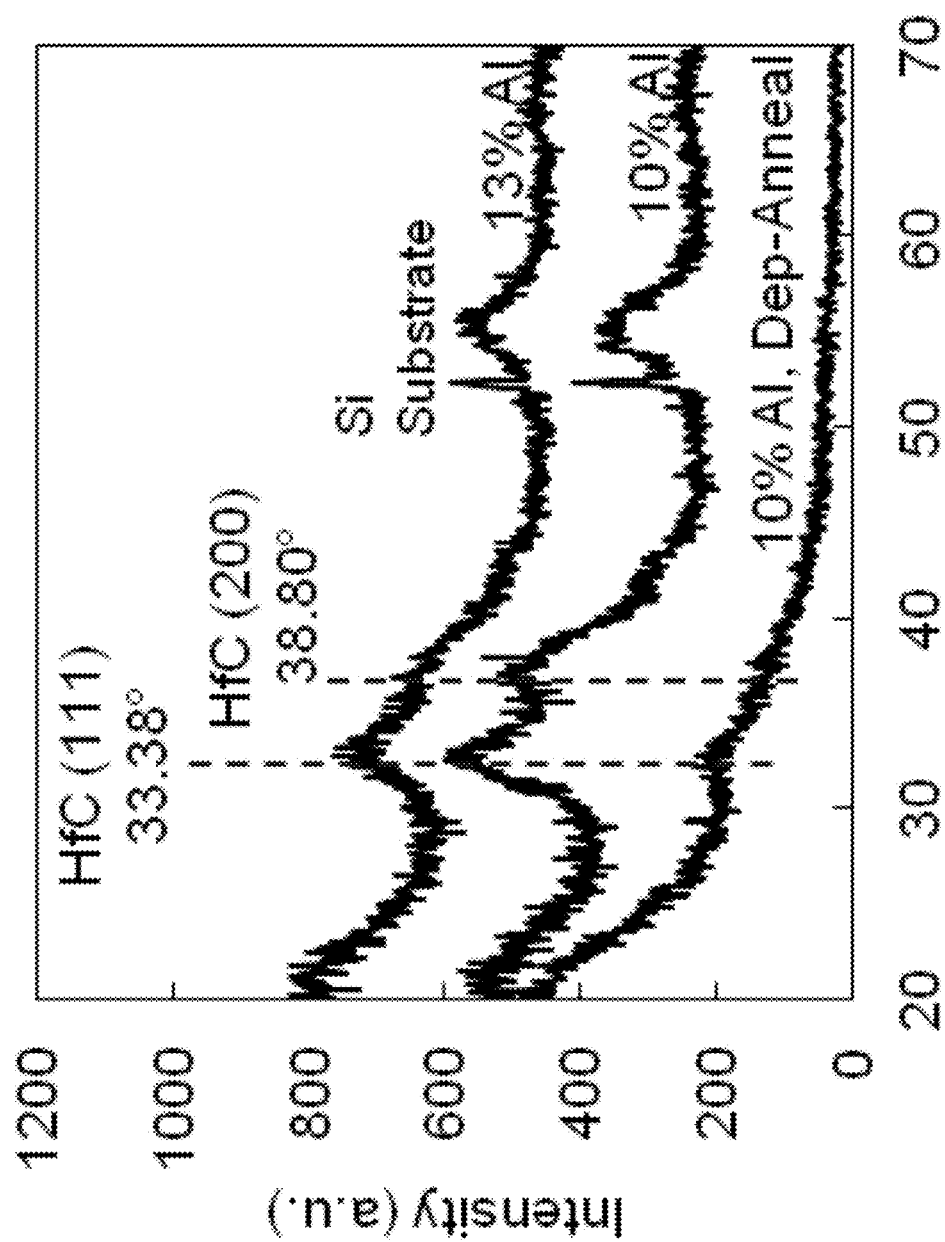
FIG. 13 presents XRD data according to some embodiments.

FIG. 13 presents XRD data for various Hf$_x$Al$_y$C$_z$ films having different concentrations of aluminum (e.g. different deposition conditions). These data indicate the presence of crystalline peaks for hafnium carbide for the as-deposited films that also included the titanium nitride adhesion layer. The hafnium carbide peaks are broad, indicating a polycrystalline phase.

Figure 14:
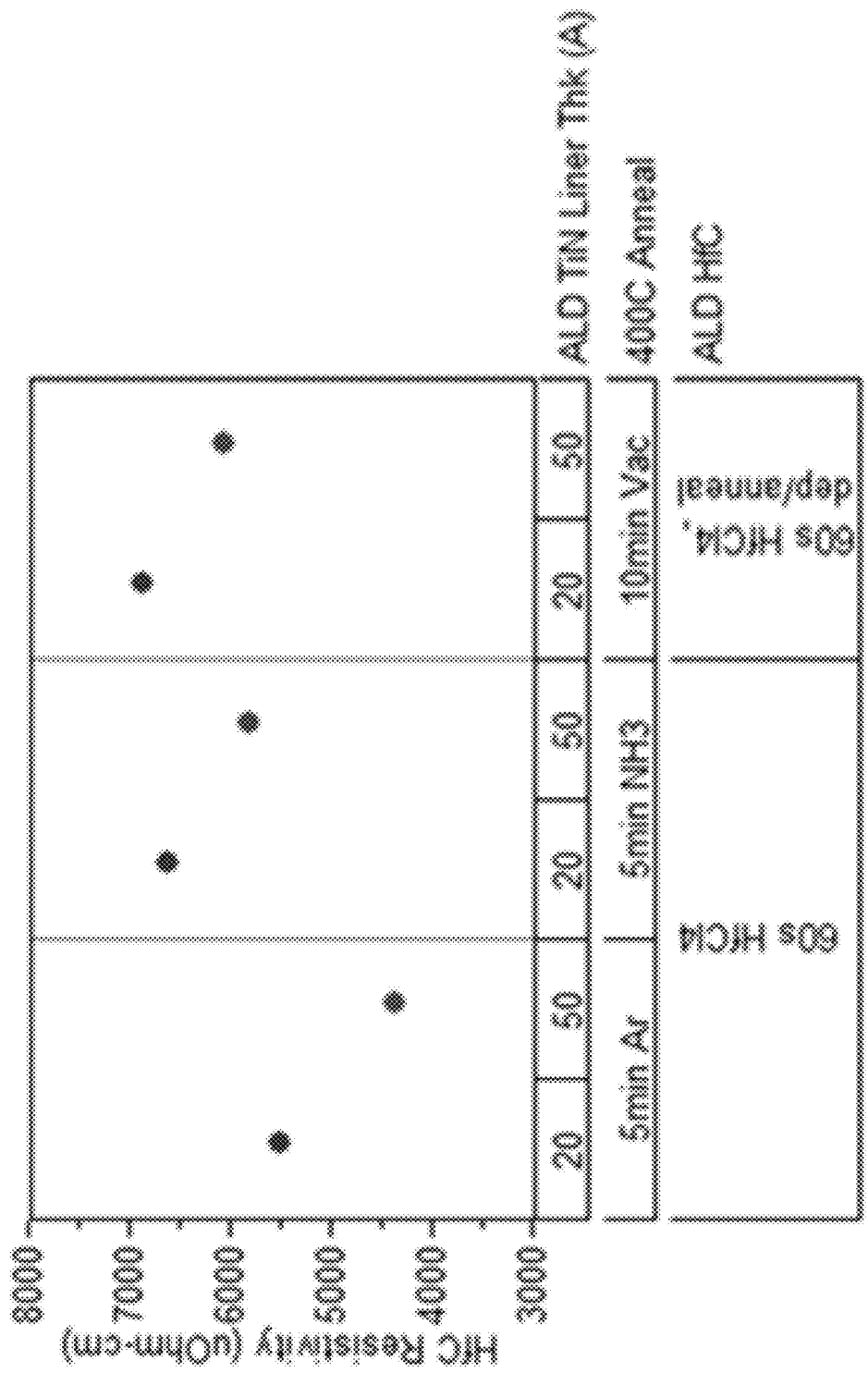
FIG. 14 presents data for HfC resistivity according to some embodiments.

FIG. 14 presents data for the resistivity of the Hf$_x$Al$_y$C$_z$ layer as a function of various deposition conditions, in-situ anneal conditions before the titanium nitride adhesion layer deposition, and the thickness of the titanium nitride adhesion layer. The samples that included a titanium nitride adhesion layer with a thickness of 50 A exhibited lower resistivities than the samples that included a titanium nitride adhesion layer with a thickness of 20 A. Both thicknesses of the titanium nitride adhesion layer provide sufficient prevention of oxidation, which would have significantly increased the film resistivity. The resistivity was independent of the various in-situ anneal conditions (e.g. prior to titanium nitride adhesion layer deposition), and was not dependent on whether the "standard" or "deposition-anneal" $Hf_xAl_yC_z$ process was employed. In general, the $Hf_xAl_yC_z$ resistivity was >4000 μΩ-cm, but could be decreased by reducing the impurity level in the film, or by implementing the titanium nitride adhesion layer deposition without air break between the $Hf_xAl_yC_z$ and titanium nitride chambers (e.g. vacuum transfer within the cluster system).

MOSCAP structures were formed to determine the electrical performance of multilayer stacks incorporating $Hf_xAl_yC_z$ work function metal layers. The multilayer stacks were similar to those described with reference to FIG. 7.

In Stack—I, a high-k dielectric layer of $HfO_x$ is deposited on an active region using an ALD process as discussed previously. A titanium nitride barrier layer is deposited above the $HfO_x$ high-k dielectric layer using an ALD process as discussed previously. A titanium nitride work function metal layer is deposited above the titanium nitride barrier layer using a PVD process as discussed previously. A $Hf_xAl_yC_z$ work function metal layer is deposited above the titanium nitride work function metal layer using an ALD process as discussed previously. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously.

In Stack—II, a high-k dielectric layer of $HfO_x$ is deposited on an active region using an ALD process as discussed previously. A titanium nitride barrier layer is deposited above the $HfO_x$ high-k dielectric layer using an ALD process as discussed previously. A $Hf_xAl_yC_z$ work function metal layer is deposited above the titanium nitride barrier layer using an ALD process as discussed previously. The thin titanium nitride barrier between the $HfO_x$ high-k dielectric layer and the $Hf_xAl_yC_z$ work function metal was sufficiently thin such that the titanium nitride barrier layer did not contribute to the effective work function (EWF) (i.e. the EWF is determined by the work function metal that is on top of the thin titanium nitride barrier layer). The aluminum concentration in the $Hf_xAl_yC_z$ work function metal layer can be 10 atomic %. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously.

In Stack—III, a high-k dielectric layer of $HfO_x$ is deposited on an active region using an ALD process as discussed previously. A titanium nitride barrier layer is deposited above the $HfO_x$ high-k dielectric layer using an ALD process as discussed previously. A $Hf_xAl_yC_z$ work function metal layer is deposited above the titanium nitride barrier layer using a deposition-anneal ALD process as discussed previously. The thin titanium nitride barrier between the $HfO_x$ high-k dielectric layer and the $Hf_xAl_yC_z$ work function metal was sufficiently thin such that the titanium nitride barrier layer did not contribute to the effective work function (EWF) (i.e. the EWF is determined by the work function metal that is on top of the thin titanium nitride barrier layer). ALD deposition parameters can be varied among the various site-isolated regions during the deposition of the $Hf_xAl_yC_z$ work function metal layers. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously.

In Stack—IV, a high-k dielectric layer of $HfO_x$ is deposited on an active region using an ALD process as discussed previously. A titanium nitride barrier layer is deposited above the $HfO_x$ high-k dielectric layer using an ALD process as discussed previously. A $Hf_xAl_yC_z$ work function metal layer is deposited above the $HfO_x$ high-k dielectric layer using an ALD process as discussed previously. The $Hf_xAl_yC_z$ work function metal layer has an aluminum concentration of about 10 atomic %. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously.

In Stack—V, a high-k dielectric layer of $HfO_x$ is deposited on an active region using an ALD process as discussed previously. A titanium nitride barrier layer is deposited above the $HfO_x$ high-k dielectric layer using an ALD process as discussed previously. A $Hf_xAl_yC_z$ work function metal layer is deposited above the titanium nitride barrier layer using an ALD process as discussed previously. The thin titanium nitride barrier between the $HfO_x$ high-k dielectric layer and the $Hf_xAl_yC_z$ work function metal was sufficiently thin such that the titanium nitride barrier layer did not contribute to the effective work function (EWF) (i.e. the EWF is determined by the work function metal that is on top of the thin titanium nitride barrier layer). The aluminum concentration in the $Hf_xAl_yC_z$ work function metal layer can be 13 atomic %. A titanium nitride adhesion layer is deposited above the $Hf_xAl_yC_z$ work function metal layer using an ALD process as discussed previously. A tungsten layer is deposited above the titanium nitride adhesion layer using a PVD process as discussed previously.

Figure 15:
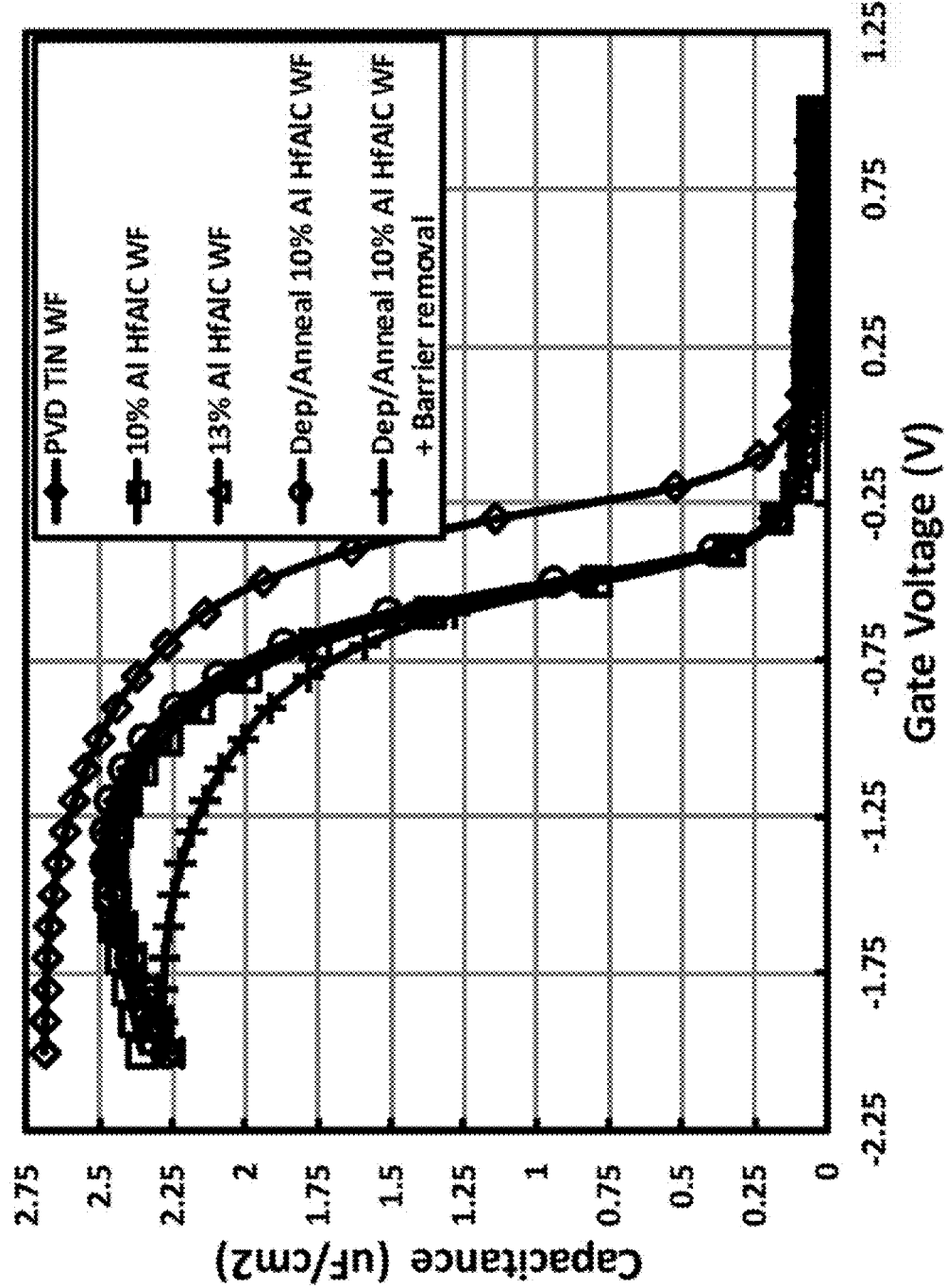
FIG. 15 presents data for capacitance versus voltage according to some embodiments.
Figure 16:
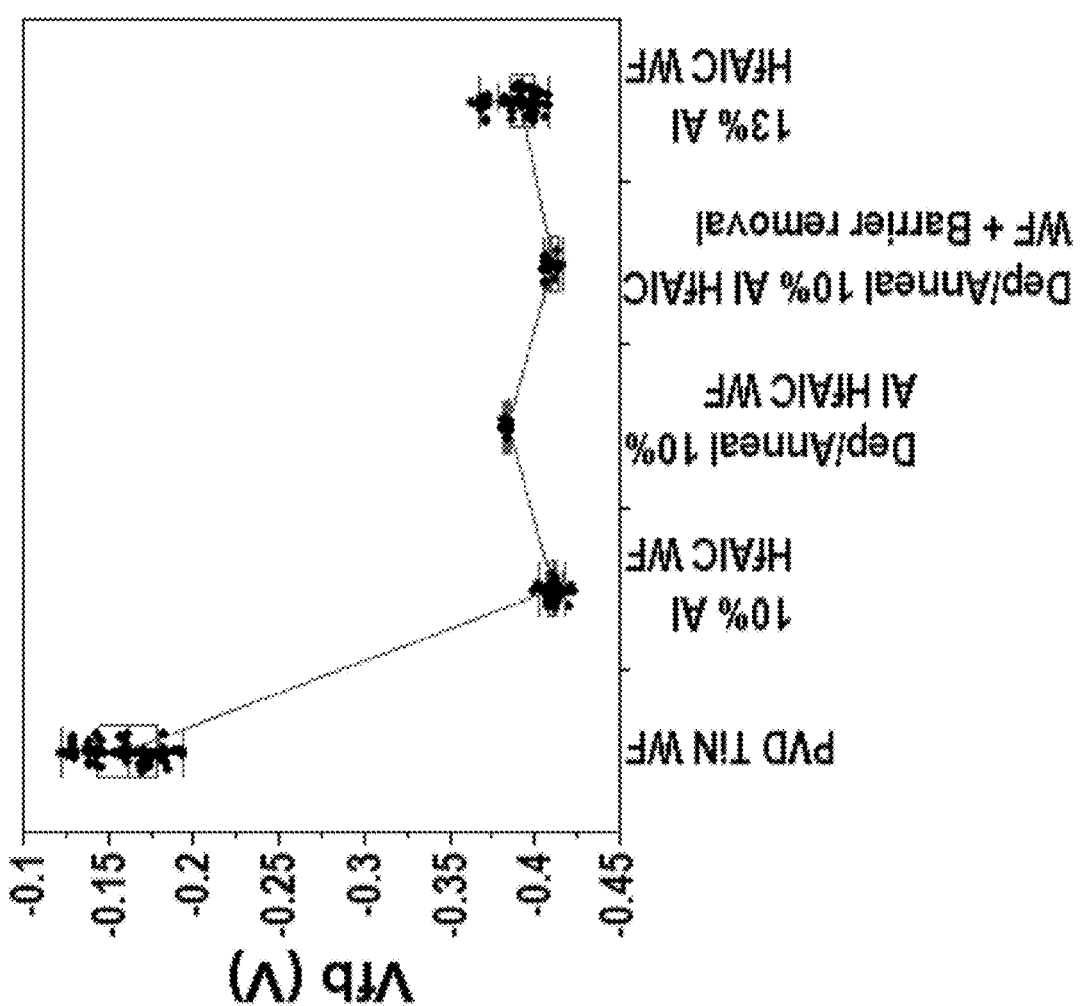
FIG. 16 presents data for flat band voltage according to some embodiments.

FIG. 15 presents capacitance—voltage (C-V) data for Stacks I-V described previously, from which the flat band voltage (Vfb) values summarized in FIG. 16 were extracted. From FIGS. 15 and 16, a clear 220-250 mV shift in the Vfb was observed in the negative direction for the $Hf_xAl_yC_z$ samples (Stacks II-V), relative to the Vfb of the titanium nitride reference sample (Stack I). The Vfb distributions of Stacks II-V in FIG. 16 were comparable to that of Stack I. FIG. 17 summarizes the EWF values that were calculated from the Vfb values. The EWF of the devices with the $Hf_xAl_yC_z$ work function metal layers was 4.6 eV, which is mid-gap relative to the titanium nitride reference, which has an EWF of 4.83 eV. In addition, the EWF was similar for all the $Hf_xAl_yC_z$ splits with varying Al content and deposition conditions, indicating a robust process with a wide process window.

In addition to the Vfb and EWF values, capacitance equivalent thickness (CET) values were extracted from the C-V plots, and the gate leakage current densities (Jg) were measured from current-voltage (I-V) measurements. The CET and Jg were characterized to determine whether the $Hf_xAl_yC_z$ work function metal layers will cause device degradation, and to verify that the $Hf_xAl_yC_z$ work function metal layers are thermally stable during forming gas anneal treatments.

Figure 18:
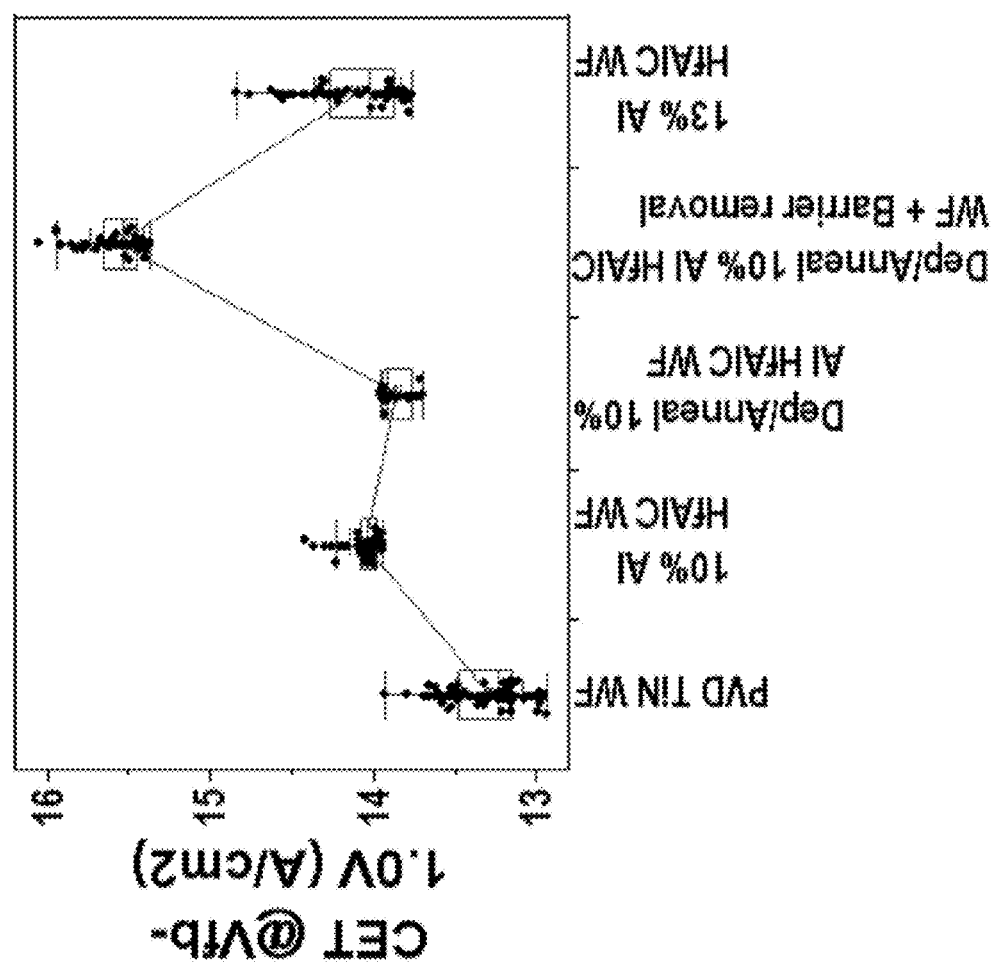
FIG. 18 presents data for capacitance equivalent thickness according to some embodiments.

FIG. 18 presents data for the CET values for the various samples (i.e. Stacks I-V). The CET and CET distributions for the samples with the $Hf_xAl_yC_z$ work function metal layers (i.e. Stacks II-V) are similar to the sample with the titanium nitride work function metal layer (i.e. Stack I), except for the sample where the CET values are significantly higher due to the removal of the titanium nitride barrier between the $HfO_2$ high-k dielectric layer and the $Hf_xAl_yC_z$ work function metal layer (e.g. the $Hf_xAl_yC_z$ layer is in direct contact with the $HfO_2$ layer—Stack IV).

Figure 19:
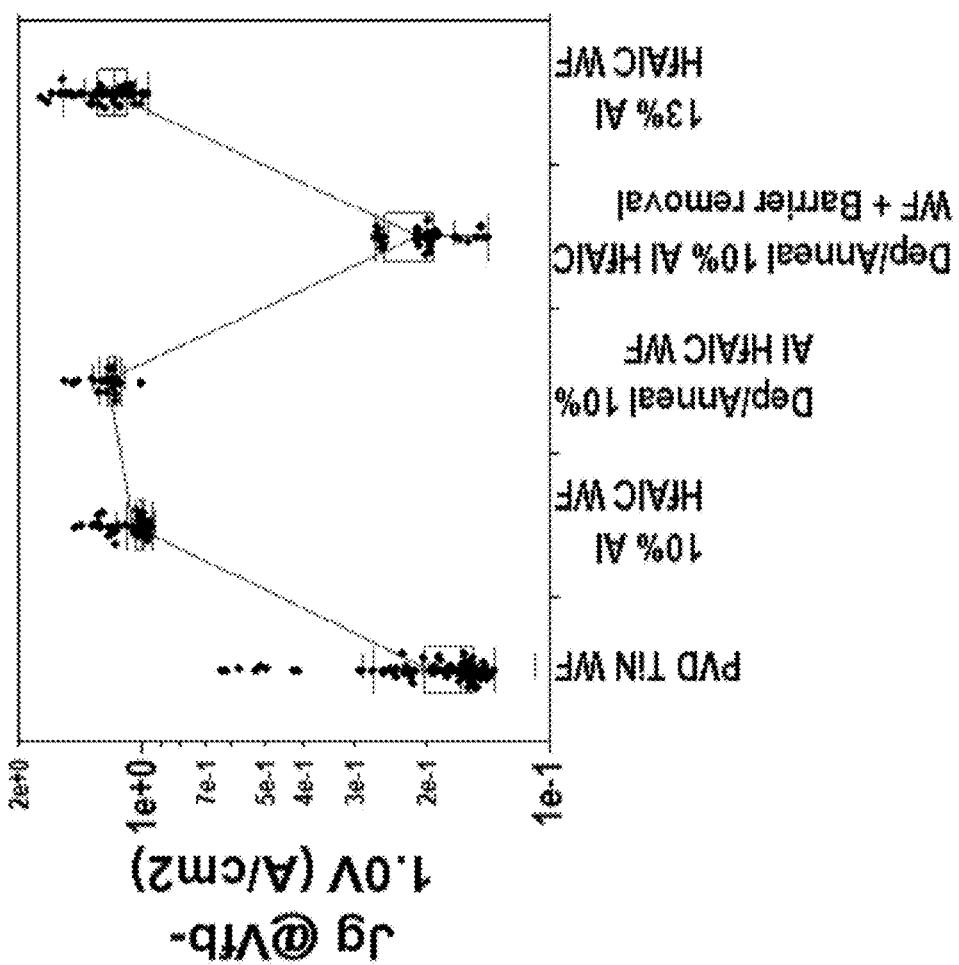
FIG. 19 presents data for leakage current density according to some embodiments.

FIG. 19 presents data for the Jg values for the various samples (i.e. Stacks I-V). As seen in FIG. 19, the leakage current density is also lower due to the removal of the titanium nitride barrier between the $HfO_2$ high-k dielectric layer and the $Hf_xAl_yC_z$ work function metal layer (e.g. the $Hf_xAl_yC_z$ layer is in direct contact with the $HfO_2$ layer—Stack IV), relative to the other samples that included the $Hf_xAl_yC_z$ work function metal layer. The high CET and the low leakage current density indicate a physical re-growth of a dielectric material when the $Hf_xAl_yC_z$ work function metal layer is in direct contact with the $HfO_2$ high-k dielectric material. It is possible that the $Hf_xAl_yC_z$ work function metal layer was prone to oxidation, and a portion of the layer may have been oxidized due to oxygen transferred from the underlying $HfO_2$ high-k dielectric layer, leading to an overall increase in the thickness of the dielectric layer. For the other samples that included the $Hf_xAl_yC_z$ work function metal layer, the thin titanium nitride barrier between the $Hf_xAl_yC_z$ work function metal layer and $HfO_2$ high-k dielectric layer prevented this oxidation.

The leakage current density (and distributions) of the samples that included the $Hf_xAl_yC_z$ work function metal layer (i.e. Stacks II-V) are generally higher than that of the sample with the titanium nitride reference (i.e. Stack I), but acceptable at ~1 A/cm$^2$. Based on the CET and Jg measurements, the $Hf_xAl_yC_z$ work function metal layer is not expected to cause significant device degradation, and the $Hf_xAl_yC_z$ work function metal layer will be thermally stable up to the 500 C forming gas anneals that were performed on the MOSCAP devices prior to electrical testing.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming and evaluating a film stack, the method comprising:
   providing a substrate,
      wherein the substrate comprises a plurality of site-isolated regions defined thereon;
   forming a first layer within each site-isolated region,
      wherein the first layer comprises a high-k dielectric material;
   forming a second layer above the first layer formed within each site-isolated region,
      wherein the second layer comprises titanium nitride;
   forming a third layer above the second layer within each site-isolated region,
      wherein the third layer comprises hafnium, aluminum, and carbon,
      wherein the third layer is formed using an atomic layer deposition process while varying one or more process parameters of the atomic layer deposition process among at least two of the plurality of site isolated regions on the substrate, and
      wherein the one or more process parameters varied during the atomic layer deposition process are selected from the group consisting of pulse duration of a hafnium containing precursor, deposition temperature, deposition pressure;
   forming a fourth layer above the third layer formed within each site-isolated region,
      wherein the fourth layer comprises titanium nitride; and
   forming a fifth layer above the fourth layer formed within each site-isolated region,
      wherein the fifth layer comprises tungsten.

2. The method of claim 1, further comprising characterizing the film stack formed within each of the plurality of site-isolated regions after the forming of the fifth layer.

3. The method of claim 2, wherein the characterizing comprises applying at least one of X-Ray Fluorescence (XRF), Spectroscopic Ellipsometry, X-Ray Diffraction (XRD), X-Ray Reflectivity (XRR), Atomic Force Microscopy (AFM), Rutherford Back Scattering (RBS), or electrical testing.

4. The method of claim 2, wherein the characterizing comprises measuring at least one of composition, thickness, crystal structure, surface roughness, resistivity, capacitance-voltage (C-V) behavior, current-voltage (I-V) behavior, capacitance equivalent thickness (GET), leakage current density, flat band voltage, or effective work function.

5. The method of claim 1, wherein a first precursor used to form the third layer comprises hafnium chloride.

6. The method of claim 5, wherein a pulse length used to introduce the first precursor is varied during the atomic layer deposition process among the at least two of the plurality of site isolated regions on the substrate between 10 seconds and 60 seconds.

7. The method of claim 1, wherein a second precursor used to form the third layer comprises trimethyl aluminum.

8. The method of claim 1, wherein a concentration of aluminum in the third layer is varied during the atomic layer deposition process among the at least two of the plurality of site isolated regions on the substrate between 10 atomic % and 13 atomic %.

9. The method of claim 1, wherein a thickness of the third layer is 50 angstroms.

10. The method of claim 1, wherein a thickness of the fourth layer is varied during the atomic layer deposition process among the at least two of the plurality of site isolated regions on the substrate between 20 angstroms and 50 angstroms.

11. The method of claim 1, further comprising annealing the substrate after the forming of the third layer and before the forming of the fourth layer.

12. The method of claim 11, wherein an atmosphere for the annealing comprises one of argon, ammonia, or vacuum.

13. The method of claim 1, wherein a first precursor used to form the third layer comprises hafnium chloride, and a pulse length used to introduce the first precursor is 10 seconds, and a concentration of aluminum in the third layer is 13 atomic % in at least one of the plurality of site isolated regions on the substrate.

14. The method of claim 1, wherein a first precursor used to form the third layer comprises hafnium chloride, and a pulse length used to introduce the first precursor is 60 seconds, and a concentration of aluminum in the third layer is 10 atomic % in at least one of the plurality of site isolated regions on the substrate.

15. The method of claim 1, wherein the forming of the third layer using an atomic layer deposition process comprises a first step of forming 10 angstroms of the third layer followed by a second step of annealing the substrate for 5 minutes, and repeating the first step and the second step a total of 5 times.

16. The method of claim 15, wherein a first precursor used to form the third layer comprises hafnium chloride.

17. The method of claim 16, wherein a pulse length used to introduce the first precursor is varied during the atomic layer deposition process among the at least two of the plurality of site isolated regions on the substrate between 10 seconds and 60 seconds.

18. The method of claim 15, wherein a second precursor used to form the third layer comprises trimethyl aluminum.

19. The method of claim 15, wherein a concentration of aluminum in the third layer is varied during the atomic layer deposition process among the at least two of the plurality of site isolated regions on the substrate between 10 atomic % and 13 atomic %.

20. The method of claim 15, wherein a thickness of the third layer is 50 angstroms.

* * * * *